(12) United States Patent
Mathiyalagan et al.

(10) Patent No.: US 12,322,433 B2
(45) Date of Patent: Jun. 3, 2025

(54) POWER AND PERFORMANCE OPTIMIZATION IN A MEMORY SUBSYSTEM

(71) Applicant: Intel Corporation, Santa Clara, CA (US)

(72) Inventors: Vijay Anand Mathiyalagan, Barasat (IN); Sambaran Mitra, Chennai (IN)

(73) Assignee: Intel Corporation, Santa Clara, CA (US)

( * ) Notice: Subject to any disclaimer, the term of this patent is extended or adjusted under 35 U.S.C. 154(b) by 839 days.

(21) Appl. No.: 17/131,585

(22) Filed: Dec. 22, 2020

(65) Prior Publication Data

US 2022/0199142 A1 Jun. 23, 2022

(51) Int. Cl.
*G11C 11/4074* (2006.01)
*G06F 11/10* (2006.01)
*G11C 11/4096* (2006.01)

(52) U.S. Cl.
CPC ...... *G11C 11/4074* (2013.01); *G06F 11/1004* (2013.01); *G11C 11/4096* (2013.01)

(58) Field of Classification Search
None
See application file for complete search history.

(56) References Cited

U.S. PATENT DOCUMENTS

| 10,297,311 B1 | 5/2019 | Yuan et al. |
| 2004/0107370 A1 | 6/2004 | Mosley |
| 2006/0149975 A1 | 7/2006 | Rotem et al. |
| 2008/0104425 A1 | 5/2008 | Gunther et al. |
| 2008/0136397 A1 | 6/2008 | Gunther et al. |
| 2011/0154081 A1 | 6/2011 | Allarey |
| 2011/0179295 A1 | 7/2011 | Jahagirdar et al. |
| 2012/0166844 A1 | 6/2012 | Morgan et al. |
| 2012/0294099 A1 | 11/2012 | Mueller |
| 2012/0324314 A1* | 12/2012 | Seshadri ............ G06F 11/1048 714/E11.035 |

(Continued)

FOREIGN PATENT DOCUMENTS

| EP | 0785549 A2 * | 7/1997 | |
| EP | 3128427 A1 * | 2/2017 | ......... G06F 11/1048 |
| JP | 2004253093 A * | 9/2004 | ............ G11C 16/10 |

OTHER PUBLICATIONS

International Search Report and Written Opinion mailed Jan. 7, 2022 for International Patent Application No. PCT/US2021/052003, 9 pages.

(Continued)

*Primary Examiner* — Guerrier Merant
(74) *Attorney, Agent, or Firm* — Nicholson De Vos Webster & Elliott LLP

(57) ABSTRACT

Hardware and/or software that dynamically enables or disables CRC and/or adjust voltage level of power supply to a physical layer block on a host by determining an optimum tradeoff between power and performance. The hardware and/or software decreases the voltage level for the power supply and enables CRC to compensate signal errors (e.g., errors from signal integrity issues). Hardware and/or software dynamically adjusts voltage level of the power supply rail based on the throughput or speed of the DDR link. In some examples, depending on read or write operations, the voltage level of the power supply rail is adjusted.

17 Claims, 9 Drawing Sheets

(56) References Cited

U.S. PATENT DOCUMENTS

| | | |
|---|---|---|
| 2013/0124806 A1 | 5/2013 | Searles et al. |
| 2014/0229666 A1 | 8/2014 | Schoenborn et al. |
| 2015/0262694 A1* | 9/2015 | Seo .................... G11C 11/5642 |
| | | 365/185.11 |
| 2015/0378603 A1 | 12/2015 | Dearth et al. |
| 2018/0322940 A1* | 11/2018 | Kim .................. G11C 13/0069 |

OTHER PUBLICATIONS

International Preliminary Report on Patentability mailed Jul. 6, 2023 for atent Application No. PCT/US2021/052003, 6 pages.

* cited by examiner

POWER AND PERFORMANCE OPTIMIZATION IN A MEMORY SUBSYSTEM

BACKGROUND

Cyclic redundancy check (CRC) is an error-detecting code used in storage devices (e.g., Dynamic Random-Access Memory (DRAM)) to detect accidental changes to raw data. CRC is enabled in some DRAM generations (e.g., double data rate (DDR) 4, DDR5) to mitigate the noise faced on data pins of DRAM channel. However, enabling CRC leads to significant bandwidth loss (e.g., up to 25%). Hence noise-immunity is obtained at a significant performance cost with CRC enabled. Additionally, PHY of memory drivers (e.g., drivers and logic of DDR links) on a processor have a fixed power supply voltage (on an I/O voltage rail) which is high enough to meet signal integrity specifications for regular DDR and low power DDR (LPDDR) signaling. This may lead to wasted power consumption during certain read and/or write operations.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
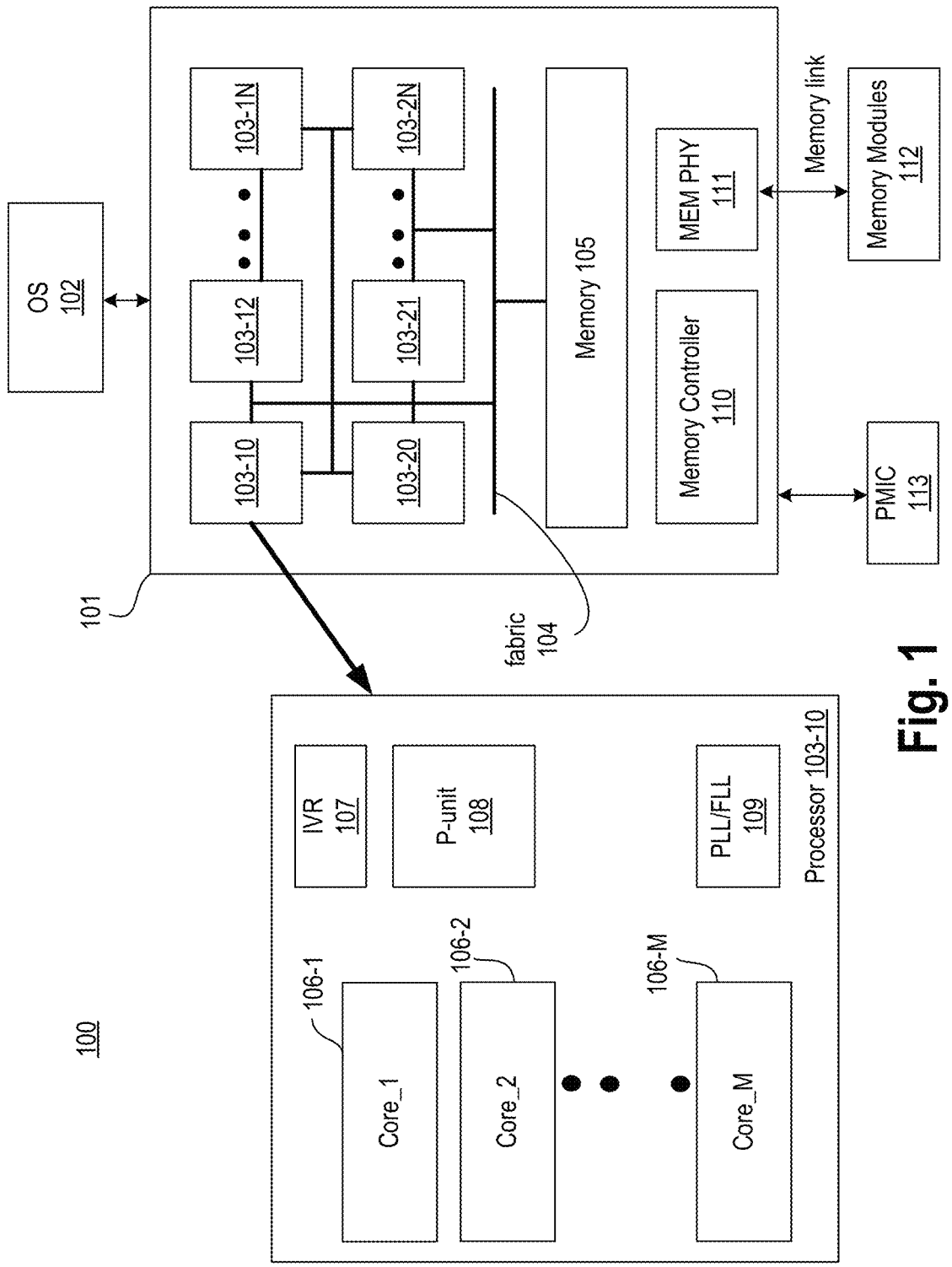
FIG. 1 illustrates a processor system with one or more power management units (p-units) to optimize power and/or performance of a memory subsystem, in accordance with some embodiments.

There are at least two ways to mitigate noise on data pins of a memory channel. One way is to enable CRC. When CRC is enabled, common errors caused by noise in transmission channels are detected. Upon detection of such errors, corrective action can be taken against data corruption. CRC increases the noise-resilience of a memory system as error on data lines can be detected and later corrected. However, enabling CRC leads to significant bandwidth loss (e.g., up to 25%). Hence noise-immunity is obtained at a significant performance cost when is CRC enabled.

Another way to mitigate noise on data pins of the memory channel is to increase the power supply (VDDQ_SOC) of the DDR PHY. DDR PHY is a DDR physical layer block on a host side. DDR PHY includes transmitter and receivers for sending and receiving data to and from a DRAM. Increasing the voltage level of the power supply to DDR PHY increases eye width and/or height, which in turn increases timing margin and reduces errors. However, increasing the voltage level of the power supply increases power consumption. Further, VDDQ_SOC for DDR PHY is a fixed quantity defined by the DDR specification for I/O Voltage rail. For low power DDR (LPDDR) such as LPDDR4× or LPDDR5, host system DDR PHY supplies higher fixed power supply voltage to the VDDQ_SOC power supply rail to meet signal integrity requirements. However, read operations (unlike write operations) may perform at lower power supply voltage for DDR PHY. To provide compatibility with LPDDR4λ, LPDDR5 and/or data rates on the DDR link, VDDQ_SOC is set at a higher voltage level (e.g., 1.1V). This may lead to unnecessary power consumption during read operations.

Some embodiments provide hardware and/or software that dynamically enables or disables CRC and/or adjust voltage level of VDDQ_SOC by determining an optimum tradeoff between power and performance. In some embodiments, hardware and/or software is provided which decreases the voltage level for VDDQ_SOC and enables CRC to compensate signal errors (e.g., errors from signal integrity issues). For example, power supply to DDR link can be reduced from 1.1V to 0.6V for 4267 MT/s while CRC is enabled for write transactions for DRAM. As such, power consumption for DDR PHY and memory system is reduced due to lower power supply level while signal integrity errors are compensated by enabling CRC. In some embodiments, performance of the system-on-chip (SoC) is improved at the cost of power consumption by increasing the voltage level at SoC for VDDQ_SOC while disabling CRC. Increasing the voltage for VDDQ_SOC increases power consumption but also reduced the errors on the data line coupling the SoC or processor with a memory. In this case, performance loss caused by enabling CRC is avoided. In on example, DDR PHY can operate at 1.3V for 4267 MT/s and CRC is disabled. Compared to the previous example, here 200 mV extra supply voltage provides similar data error protection as enabling CRC in the first example.

In some embodiments, hardware and/or software is provided that dynamically adjusts voltage level of VDDQ_SOC power supply rail based on the throughput or speed of the DDR link. In some embodiments, depending on read or write operations, voltage level of VDDQ_SOC power supply rail is adjusted. In some embodiments, during DRAM reads, the voltage of VDDQ_SOC rail is reduced to desired value. In some embodiments, during DRAM writes the voltage value of VDDQ_SOC rail is brought back to a higher value. In some embodiment, a memory controller (MC) evaluates the traffic on the data line of the DDR link to identify a continuous-read or continuous-write duration where voltage-change to VDDQ_SOC is worthwhile. In some embodiments, MC may also alter the read and/or write sequence opportunistically to create a continuous-read and/or write scheduling window to enable voltage change. In some embodiments, MC sends command to Power Management Agent (PMA) or p-unit to adjust the voltage to desired value before issuing read or write command.

In some embodiments, for SoC driving data to the DRAM, the voltage of VDDQ_SOC power supply rail is kept at different levels for different operating frequencies. Traditionally, VDDQ_SOC operates at a fixed voltage for all frequencies. For example, with LPDDR4λ, VDDQ_SOC is set to 1.1V for all frequencies. In one instant, p-unit sets the voltage of VDDQ_SOC of the DDR link at 0.6V when the speed of the DDR link is up to 3200 MT/s. In another instance, p-unit sets the voltage of VDDQ_SOC at 0.9V when speed of the DDR link is up to 3722 MT/s. In another instance, p-unit sets the voltage of VDDQ_SOC at 1.1V when speed of the DDR link is up to 4267 MT/s. This increased voltage provides noise margin to operate the DDR link at higher speeds. The dynamic scaling of VDDQ_SOC based on various operating frequencies of the memory data link (e.g., DDR compliant data link) allows for optimized tradeoff between power and performance.

While various embodiments are described with reference to DRAM as the memory and DDR as the memory IO data link signaling scheme, the embodiments are applicable to any memory and IO link. In some embodiments, an apparatus is provided which comprises a memory controller and a memory IO physical layer coupled to the memory controller. In some embodiments, the apparatus includes a voltage supply generator coupled to the memory IO physical layer, wherein the voltage supply generator provides an adjustable voltage supply to the memory IO physical layer, wherein the memory controller instructs the voltage supply generator directly or indirectly to change the adjustable voltage supply according to noise level on a data link that couples the memory IO physical layer to a memory. In some embodiments, the memory controller enables or disables an error detection mechanism according to noise level on the data link. In some embodiments, the memory controller decreases the voltage level of the adjustable voltage supply and enable the error detection mechanism. In some embodiments, the memory controller increases the voltage level of the adjustable voltage supply and to disable the error detection mechanism. In some embodiments, the memory controller dynamically enables or disables the error detection mechanism and/or adjust a voltage to the adjustable voltage supply. In some embodiments, the error detection mechanism comprises cyclic redundancy check.

In some embodiments, the memory controller is to club read operations together, and wherein the memory controller instructs the voltage supply generator to directly or indirectly to lower the adjustable voltage supply prior to the read operations. In some embodiments, the memory controller clubs write operations together, and wherein the memory controller instructs the voltage supply generator to directly or indirectly to increase the adjustable voltage supply prior to the write operations. In some embodiments, the memory controller instructs the voltage supply generator directly or indirectly increases the adjustable voltage supply prior to the write operations even when there is a high priority read operation between write operations.

In some embodiments, the memory controller determines a transfer rate of the data link, and instructs the voltage supply generator directly or indirectly to change the adjustable voltage supply according to the transfer rate of the data link. In some embodiments, the memory controller instructs the voltage supply generator directly or indirectly to increase the adjustable voltage supply if the transfer rate of the data link increases. In some embodiments, the memory controller instructs the voltage supply generator directly or indirectly to decrease the adjustable voltage supply if the transfer rate of the data link decrease. In some embodiments, the memory is a DRAM. In some embodiments, the data link is a DDR compliant data link.

There are many technical effects of various embodiments. For example, with dynamic decision-making framework, the SoC can balance between performance-critical and power-critical operations by switching between performance-critical mode and power-critical-mode, and back. This enables the SoC to be most optimal during operation. In another case, where performance loss due to enabling of CRC is acceptable, there can be power savings. Power is proportional to $V^2$. Power consumed has a square relationship to voltage, hence reducing voltage during read operations result in significant power savings. Using this relationship, a reduction in voltage from 1.1V to 0.6V, has approximately 70% power reduction in VDDQ_SOC-rail-power during read operations. In some examples, there can be approximately 12% performance gain by not enabling CRC and instead increasing voltage of the VDDQ_SOC power supply rail to compensate for signal errors on the DDR data lines. While power consumption may increase, signal integrity improves which may be useful in performance critical systems.

In some instances, there are power-savings of about 15-20% in SoC DDR PHY, by reducing the voltage of VDDQ_SOC rail during DRAM reads. Reducing the voltage of VDDQ_SOC rail during DRAM reads may have minimal performance impact to no impact on performance critical systems. In some embodiments, the MC bunches up or clubs read and write tasks by default for performance efficient scheduling. Various embodiments use the continuous read and/or write zones (e.g., clubbed read and/or write tasks) to enable voltage adjustment of VDDQ_SOC for power gains. Traditionally, the voltage of VDDQ_SOC is not reduced for lower DDR speed of operations. Various embodiments dynamically or adaptively reduce voltage for lower speed DDR link speed, which results in approximately 10% to 20% power reduction in the SoC DDR PHY. Other technical effects will be evident from the various figures and embodiments.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

FIG. 1 illustrates processor system 100 with an integrated dual loop voltage regulator, in accordance with some embodiments. Processor system 100 comprises processor 101 coupled to operating system (OS) 102. Processor 101 comprises one or more processors 103 (individually labeled as processors 103_10 through 103_1N, and 103_20 through 103_2N, where 'N' is a number), fabric 104 connecting the processor 103, memory 105, memory controller 110, and memory physical layer (MEM PHY) 111. In some embodiments, each processor 103 is a die, dielet, or chiplet. Here the term "die" generally refers to a single continuous piece of semiconductor material (e.g. silicon) where transistors or other components making up a processor core may reside. Multi-core processors may have two or more processors on a single die, but alternatively, the two or more processors may be provided on two or more respective dies. Each die has a dedicated power controller or power control unit (p-unit) power controller or power control unit (p-unit) which can be dynamically or statically configured as a supervisor or supervisee. In some examples, dies are of the same size and functionality i.e., symmetric cores. However, dies can also be asymmetric. For example, some dies have different size and/or function than other dies. Each processor 103 may also be a dielet or chiplet. Here the term "dielet" or "chiplet" generally refers to a physically distinct semiconductor die, typically connected to an adjacent die in a way that allows the fabric across a die boundary to function like a single fabric rather than as two distinct fabrics. Thus at least some dies may be dielets. Each dielet may include one or more p-units which can be dynamically or statically configured as a supervisor, supervisee or both.

In some embodiments, fabric 104 is a collection of interconnects or a single interconnect that allows the various dies to communicate with one another. Here the term "fabric" generally refers to communication mechanism having a known set of sources, destinations, routing rules, topology and other properties. The sources and destinations may be any type of data handling functional unit such as power management units. Fabrics can be two-dimensional spanning along an x-y plane of a die and/or three-dimensional (3D) spanning along an x-y-z plane of a stack of vertical and horizontally positioned dies. A single fabric may span multiple dies. A fabric can take any topology such as mesh topology, star topology, daisy chain topology. A fabric may be part of a network-on-chip (NoC) with multiple agents. These agents can be any functional unit.

In some embodiments, each processor 103 may include a number of processor cores. One such example is illustrated with reference to processor 103_10. In this example, processor 103_10 includes a plurality of processor cores 106-1 through 106-M, where M is a number. For the sake of simplicity, a processor core is referred by the general label 106. Here, the term "processor core" generally refers to an independent execution unit that can run one program thread at a time in parallel with other cores. A processor core may include a dedicated power controller or power control unit (p-unit) which can be dynamically or statically configured as a supervisor or supervisee. This dedicated p-unit is also referred to as an autonomous p-unit, in some examples. In some examples, all processor cores are of the same size and functionality i.e., symmetric cores. However, processor cores can also be asymmetric.

For example, some processor cores have different size and/or function than other processor cores. A processor core can be a virtual processor core or a physical processor core. Processor 103_10 may include an integrated voltage regulator (IVR) 107, power control unit (p-unit) 108, phase locked loop (PLL) and/or frequency locked loop (FLL) 109. The various blocks of processor 103_10 may be coupled via an interface or fabric. Here, the term "interconnect" refers to a communication link, or channel, between two or more points or nodes. It may comprise one or more separate conduction paths such as wires, vias, waveguides, passive components, and/or active components. It may also comprise a fabric. In some embodiments, p-unit 108 is coupled to OS 102 via an interface. Here the term "interface" generally refers to software and/or hardware used to communicate with an interconnect. An interface may include logic and I/O driver/receiver to send and receive data over the interconnect or one or more wires.

In some embodiments, each processor 103 is coupled to a power supply via voltage regulator. The voltage regulator may be internal to processor system 101 (e.g., on the package of processor system 101) or external to processor system 101. In some embodiments, each processor 103 includes IVR 107 that receives a primary regulated voltage from the voltage regulator of processor system 101 and generates an operating voltage for the agents of processor 103. The agents of processor 103 are the various components of processor 103 including cores 106, IVR 107, p-unit 108, PLL/FLL 109, etc.

Accordingly, an implementation of IVR 107 may allow for fine-grained control of voltage and thus power and performance of each individual core 106. As such, each core 106 can operate at an independent voltage and frequency, enabling great flexibility and affording wide opportunities for balancing power consumption with performance. In some embodiments, the use of multiple IVRs enables the grouping of components into separate power planes, such that power is regulated and supplied by the IVR to only those components in the group. For example, each core 106 may include an IVR to manage power supply to that core where that IVR receives input power supply from the regulated output of IVR 107 or voltage regulator of processor system 101. During power management, a given power domain of one IVR may be powered down or off when the processor core 106 is placed into a certain low power state, while another power domain of another IVR remains active, or fully powered. As such, an IVR may control a certain domain of a logic or processor core 106. Here the term "domain" generally refers to a logical or physical perimeter that has similar properties (e.g., supply voltage, operating frequency, type of circuits or logic, and/or workload type) and/or is controlled by a particular agent. For example, a domain may be a group of logic units or function units that are controlled by a particular supervisor. A domain may also be referred to an Autonomous Perimeter (AP). A domain can be an entire system-on-chip (SoC) or part of the SoC, and is governed by a p-unit.

In some embodiments, each processor 103 includes its own p-unit 108. P-unit 108 controls the power and/or performance of processor 103. P-unit 108 may control power and/or performance (e.g., IPC, frequency) of each individual core 106. In various embodiments, p-unit 108 of each processor 103 is coupled via fabric 104. As such, the p-units 108 of each processor 103 communicate with another and OS 102 to determine the optimal power state of processor system 101 by controlling power states of individual cores 106 under their domain.

P-unit 108 may include circuitry including hardware, software and/or firmware to perform power management operations with regard to processor 103. In some embodiments, p-unit 108 provides control information to voltage regulator of processor system 101 via an interface to cause the voltage regulator to generate the appropriate regulated voltage. In some embodiments, p-unit 108 provides control information to IVRs of cores 106 via another interface to control the operating voltage generated (or to cause a corresponding IVR to be disabled in a low power mode). In some embodiments, p-unit 108 may include a variety of power management logic units to perform hardware-based power management. Such power management may be wholly processor controlled (e.g., by various processor hardware, and which may be triggered by workload and/or power, thermal or other processor constraints) and/or the power management may be performed responsive to external sources (such as a platform or power management source or system software). In some embodiments, p-unit 108 is implemented as a microcontroller.

The microcontroller can be an embedded microcontroller which is a dedicated controller or as a general-purpose controller. In some embodiments, p-unit 108 is implemented as a control logic configured to execute its own dedicated power management code, here referred to as pCode. In some embodiments, power management operations to be performed by p-unit 108 may be implemented externally to a processor 103, such as by way of a separate power management integrated circuit (PMIC) 113 or other component external to processor system 101. In yet other embodiments, power management operations to be performed by p-unit 108 may be implemented within BIOS or other system software. In some embodiments, p-unit 108 of a processor 103 may assume a role of a supervisor or supervisee.

Here the term "supervisor" generally refers to a power controller, or power management, unit (a "p-unit"), which monitors and manages power and performance related parameters for one or more associated power domains, either alone or in cooperation with one or more other p-units. Power/performance related parameters may include but are not limited to domain power, platform power, voltage, voltage domain current, die current, load-line, temperature, device latency, utilization, clock frequency, processing efficiency, current/future workload information, and other parameters. It may determine new power or performance parameters (limits, average operational, etc.) for the one or more domains. These parameters may then be communicated to supervisee p-units, or directly to controlled or monitored entities such as VR or clock throttle control registers, via one or more fabrics and/or interconnects. A supervisor learns of the workload (present and future) of one or more dies, power measurements of the one or more dies, and other parameters (e.g., platform level power boundaries) and determines new power limits for the one or more dies. These power limits are then communicated by supervisor p-units to the supervisee p-units via one or more fabrics and/or interconnect. In examples where a die has one p-unit, a supervisor (Svor) p-unit is also referred to as supervisor die.

Here the term "supervisee" generally refers to a power controller, or power management, unit (a "p-unit"), which monitors and manages power and performance related parameters for one or more associated power domains, either alone or in cooperation with one or more other p-units and receives instructions from a supervisor to set power and/or performance parameters (e.g., supply voltage, operating frequency, maximum current, throttling threshold, etc.) for its associated power domain. In examples where a die has one p-unit, a supervisee (Svee) p-unit may also be referred to as a supervisee die. Note that a p-unit may serve either as a Svor, a Svee, or both a Svor/Svee p-unit In various embodiments, p-unit 108 executes a firmware (referred to as pCode) that communicates with OS 102. In various embodiments, each processor 103 includes a PLL or FLL 109 that generates clock from p-unit 108 and input clock (or reference clock) for each core 106. Cores 106 may include or be associated with independent clock generation circuitry such as one or more PLLs to control operating frequency of each core 106 independently.

In some embodiments, memory controller (MC) 110 manages read and/or write operations with one or more memory modules 112. The memory modules 112 are coupled to processor 101 via memory physical layer (MEM PHY) 111. In some embodiments, MC 110 include hardware and/or software that dynamically enables or disables CRC and/or adjust voltage level of VDDQ_SOC to MEM PHY 111 by determining an optimum tradeoff between power and performance In some embodiments, MC 110 and/or a power management unit or 101 or p-unit 108 (e.g., supervisor p-unit 108) decreases the voltage level for VDDQ_SOC to MEM PHY 111 and enables CRC to compensate signal errors (e.g., errors from signal integrity issues). For example, power supply to Memory link (e.g., DDR link) can be reduced from 1.1V to 0.6V for 4267 MT/s while CRC is enabled for write transactions for Memory modules 112 (e.g., DRAM). As such, power consumption for MEM PHY 111 and memory system (e.g., comprising memory controller 110, MEM PHY 111, and memory modules 112) is reduced due to lower power supply level while signal integrity errors are compensated by enabling CRC. CRC generates an initial checksum of the data in memory that can be later compared with the calculated checksum for mismatch. A checksum mismatch can indicate an otherwise undetectable memory fault.

In some embodiments, performance of the system-on-chip (SoC) or processor system 101 is improved at the cost of power consumption by increasing the voltage level at SoC for VDDQ_SOC while disabling CRC. Here, VDDQ_SOC is the power supply to MEM PHY 111. Increasing the voltage for VDDQ_SOC increases power consumption of MEM PHY 111 but also reduces the errors on the data line (e.g., Memory Link) coupling the SoC or processor with a memory. In this case, performance loss caused by enabling CRC is avoided. In one example, MEM PHY 111 can operate at 1.3V for 4267 MT/s and CRC is disabled. Compared to the previous example, here 200 mV extra supply voltage provides similar data error protection as enabling CRC in the first example.

In some embodiments, MC 110, power management controller of processor 101, and/or p-unit 108 (e.g., a supervisor p-unit) dynamically adjusts voltage level of VDDQ_SOC power supply rail based on the throughput or speed of the memory link. In some embodiments, depending on read or write operations, voltage level of VDDQ_SOC power supply rail is adjusted. In various embodiments, memory controller 110 is aware of upcoming read and/or write operations. In some embodiments, during reads from memory modules 112, the voltage of VDDQ_SOC rail is reduced to desired value. In some embodiments, during writes to memory modules 112 the voltage value of VDDQ_SOC rail is brought back to a higher value. In some embodiment, MC 110 evaluates the traffic on the memory link to identify a continuous-read or continuous-write duration where voltage-change to VDDQ_SOC is worthwhile. In some embodiments, MC 110 may also alter the read and/or write sequence opportunistically to create a continuous-read and/or write scheduling window to enable voltage change. For example, MC 110 clubs write and read operations in batches and lowers VDDQ_SOC during scheduling of read operations and raises VDDQ_SOC during scheduling of write operations. In some embodiments, MC 110 sends command to Power Management Agent (PMA) or p-unit 108 to adjust the voltage to desired value before issuing read or write command.

In some embodiments, for processor 101 driving data to the memory modules 112, the voltage of VDDQ_SOC power supply rail is kept at different levels for different operating frequencies. Traditionally, VDDQ_SOC operates at a fixed voltage for all frequencies. For example, with LPDDR4λ, VDDQ_SOC is set to 1.1V for all frequencies. In one instant, p-unit 108 sets the voltage of VDDQ_SOC of the DDR link at 0.6V when the speed of the DDR link is up to 3200 MT/s. In another instance, p-unit 108 sets the voltage of VDDQ_SOC at 0.9V when speed of the DDR link is up to 3722 MT/s. In another instance, p-unit 108 sets the voltage of VDDQ_SOC at 1.1V when speed of the DDR link is up to 4267 MT/s. This increased voltage provides noise margin to operate the DDR link at higher speeds. The dynamic scaling of VDDQ_SOC based on various operating frequencies of the memory data link allows for optimized tradeoff between power and performance.

While various embodiments are described with reference to DRAM for memory modules 112 and DDR as the memory link signaling scheme, the embodiments are applicable to any memory and IO link.

Figure 2:
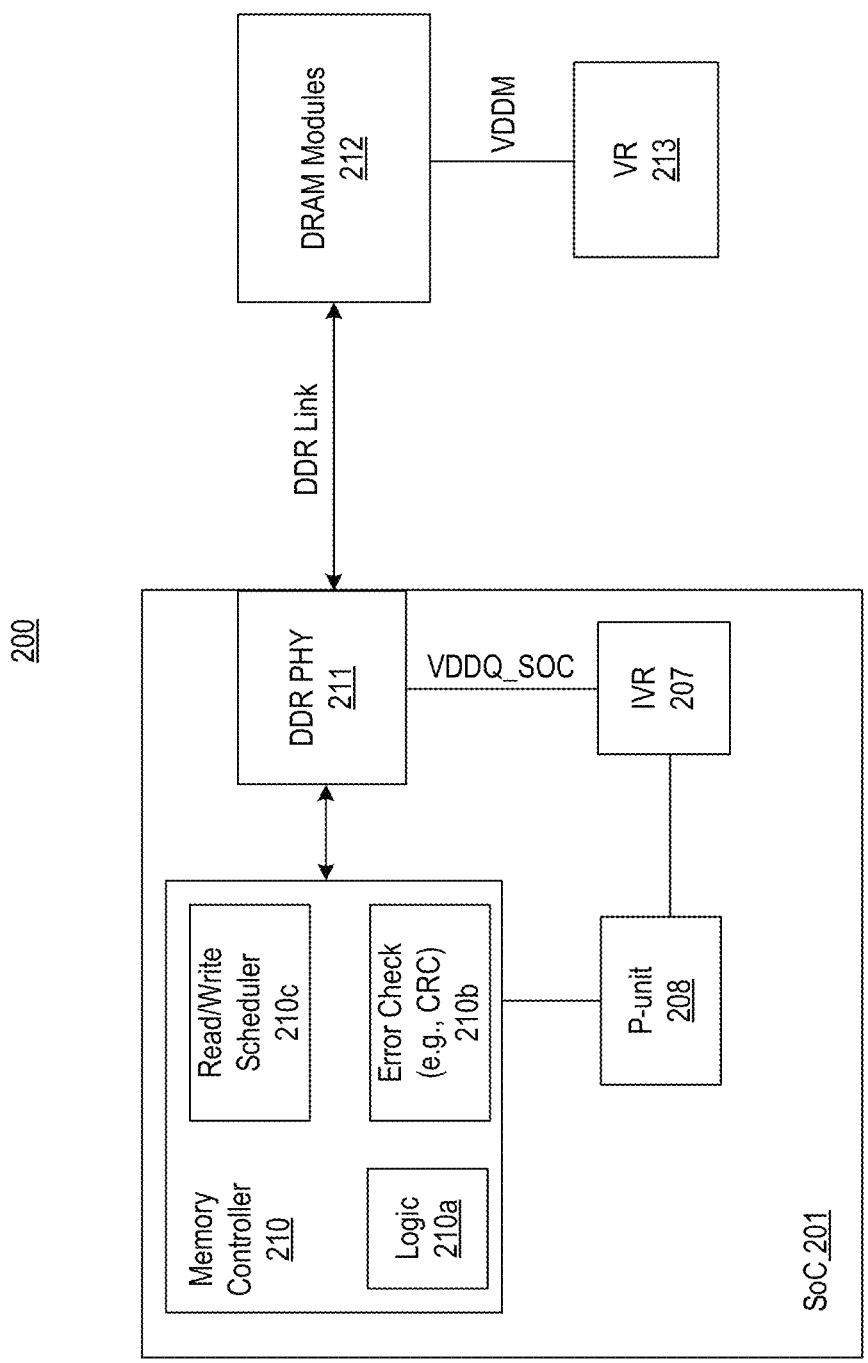
FIG. 2 illustrates another implementation of a processor system with hardware and/or software for dynamic enablement of Cyclic Redundancy Check (CRC) and/or adjustment of power supply to a memory physical layer (PHY), in accordance with some embodiments.

FIG. 2 illustrates another implementation of a processor system 200 with hardware and/or software for dynamic enablement of CRC and/or adjustment of power supply to a memory PHY, in accordance with some embodiments. Processor system 200 may have same components and architecture as processor system 100. Here, additional details are illustrated for memory controller 110 (relabeled as 210) while processor 101 is relabeled as system-on-chip 201. Additional details of SoC 201 are illustrated with reference to FIG. 8. Referring back to FIG. 2, memory controller 210 comprises logic 210a, error check logic 210b, and read/write scheduler 210c. In some embodiments, SoC 201 comprises data link physical (PHY) layer 211. Here, the PHY layer is a DDR PHY 211 which is powered by VDDQ_SOC. However, the embodiments are not limited to DDR PHY 211 and other PHYs may be used.

In some embodiments, memory controller 210 and/or p-unit 208 enable or disable error check function 210b and/or adjust voltage level of VDDQ_SOC to a DDR PHY 211 on SoC 201 by determining an optimum tradeoff between power and performance. The various functions for power and performance tradeoff are performed by hardware and/or software of memory controller 210 and/or p-unit 208. In some embodiments, memory controller 210 and/or p-unit 208 decreases the voltage level for VDDQ_SOC and enables the error check function (e.g., CRC) to compensate signal errors (e.g., errors from signal integrity issues) on data retrieved/sent from/to DDR link. In some embodiments, memory controller 210 and/or p-unit 208 dynamically adjusts voltage level of the power supply rail VDDQ_SOC based on the throughput or speed of the DDR link. In some examples, depending on read or write operations as determined by scheduler 210c, the voltage level of the power supply rail VDDQ_SOC is adjusted. While various embodiments are described with reference to CRC as the error check mechanism, which is enabled or disabled, other error check mechanisms can also be used.

In some embodiments, logic 210a decides between voltage change on VDDQ_SOC or CRC-enabling in case of increased noise scenarios. In some embodiments, logic 210a determines the need of additional noise immunity. For example, errors on data link are above a threshold limit, and so logic 210a determines that CRC should be enabled. As such when logic 210a assesses that there is noisy ambience, then for performance critical systems, VDDQ_SOC adjustment is employed. For example, VDDQ_SOC is increased to reduce errors on the data link. In some embodiments, for power critical systems, logic 210a enables CRC mechanism. If over the course of time logic 210a notices that data link errors have reduced, logic 210a can dynamically move back to low-power-high-performance default state. For example, logic 21a can cause the voltage level on VDDQ_SOC to reduce.

In some embodiments, Read/Write Scheduler 210c clubs or coalesces low priority reads, high priority reads, and writes in bunches. In some embodiments, high priority reads are not clubbed as they may appear in any sequence of performing tasks. In some embodiments, Read/Write Scheduler 210c predicts a continuous-read zone and instructs the p-unit 208 to reduce the VDDQ_SOC rail voltage to DDR-PHY 207 when read operations are being performed. Here, continuous-read zones are read instructions clubbed or bunched together so they are executed in together or sequentially before or after any write operation. In various embodiments, VDDQ_SOC is reduced by IVR 207. For example, a reference voltage to an error comparator of a DC-DC converter is adjusted to change the power supply voltage level for VDDS_SOC. In some embodiments, Read/Write Scheduler 210c predicts a continuous-write zone and instructs p-unit 208 to increase the VDDQ_SOC rail voltage to DDR-PHY 211. Here, continuous-write zones are write instructions clubbed or bunched together so they are executed in together or sequentially before or after any read operation. In some embodiments, high priority read are handled differently. If a high priority read arrives that needs to disrupt the continuous-write-zone, read/write scheduler 210c may not pull down the voltage of VDDQ_SOC and may execute the reads with high VDDQ_SOC voltage itself. In one such embodiments, read/write scheduler 210c may quickly transition back to original continuous-write-zone.

For a high-performance DRAM, MC 210 prevents a single DRAM read from alternating with a single DRAM write. As frequent switching between DRAM-read and DRAM-write leads to costly turnaround latencies on DDR link, a MC read/write scheduler 210c groups DRAM reads together and groups DRAM writes together. In some embodiments, MC read/write scheduler 210c gives read operations a higher priority than writes since writes are generally of posted-nature. Here, posted-nature generally refers to a situation when an agent (e.g., a CPU) can write data into a memory controller buffer and consider it complete even before the data makes it from the memory-controller-buffer to an external memory (e.g., DRAM), which is the final destination. Due to posted nature of write, many memory-controllers give higher priority to reads most of the time, because the memory-controller-buffer can absorb certain amount of writes from an agent (like CPU) without immediately pushing it to the external memory (or final destination). After a bunch of write operations are queued up within MC 210, MC scheduler 210c drains the write operations in a burst. While draining write operations, an escape condition is kept for switching to a read operation in case a high priority read operation arrives in between, requiring immediate servicing (example real-time).

In some embodiments, to accommodate quick switching between two levels of voltages for VDDQ_SOC rail, there are two sets of DRAM-timing-registers. The value of both set of timing registers is determined during DRAM-initialization and training sequence, in accordance with some embodiments. This ensures that during voltage switch (e.g., every voltage switch) long training sequence may not be performed repeatedly.

In various embodiments, error check 210b performs noise detection and/or correction to data sent/received over DDR link. Here, CRC is used as an example for error correction. CRC generates an initial checksum of the data in memory that can be later compared with the calculated checksum for mismatch. A checksum mismatch can indicate an otherwise undetectable memory fault. However, other error detection and/or correction techniques can also be used. For example, detection scheme such as cryptographic hash function, parity bit, repetition codes, checksum, minimum distance coding, error correction code, may be used instead of or in addition to CRC. Likewise, correction schemes such as forward error correction, automatic repeat request, etc. can be used instead of or in addition to CRC.

In some embodiments, MC 210 and/or a power management unit 208 decreases the voltage level for VDDQ_SOC to DDR PHY 211 and enables CRC (and/or any other suitable error detection/correction scheme) to compensate signal errors (e.g., errors from signal integrity issues) on DDR link. For example, power supply VDDQ_SOC to DDR PHY 211 is reduced from 1.1V to 0.6V for 4267 MT/s while CRC is enabled for write transactions for DRAM 212. As such, power consumption for DDR PHY 211 and memory system (e.g., comprising memory controller 110, DDR PHY 211, and DRAM modules 212) is reduced due to lower power supply level while signal integrity errors are compensated by enabling CRC.

In some embodiments, performance of SoC 201 is improved at the cost of power consumption by increasing the voltage level VDDQ_SOC while disabling CRC (and/or any additional error detection/correction scheme). Increasing the voltage for VDDQ_SOC increases power consumption of DDR PHY 211 but also reduces the errors on the DDR link coupling SoC 201 with DRM 212. In this case, performance loss caused by enabling CRC is avoided.

In some embodiments, VDDQ_SOC is generated and/or regulated by IVR 207. IVR 207 may be controlled by p-unit 208 and/or memory controller 210. For example, p-unit 208 and/or memory controller 210 may instruct IVR 207 directly or indirectly to increase or decrease VDDQ_SOC based on power and/or performance tradeoff of the memory subsystem. IVR 207 may include a low dropout (LDO) regulator or a DC-DC converter. In some embodiments, power VDDM to memory modules (e.g., DRAM modules 212) is provided by a separate regulator VR 213. In some embodiments, VR 213 is implemented as any suitable DC-DC converter. In some embodiments VR 213 is off-die (e.g., outside of Soc 201). For example, VR 213 is on package or on motherboard.

Figure 3:
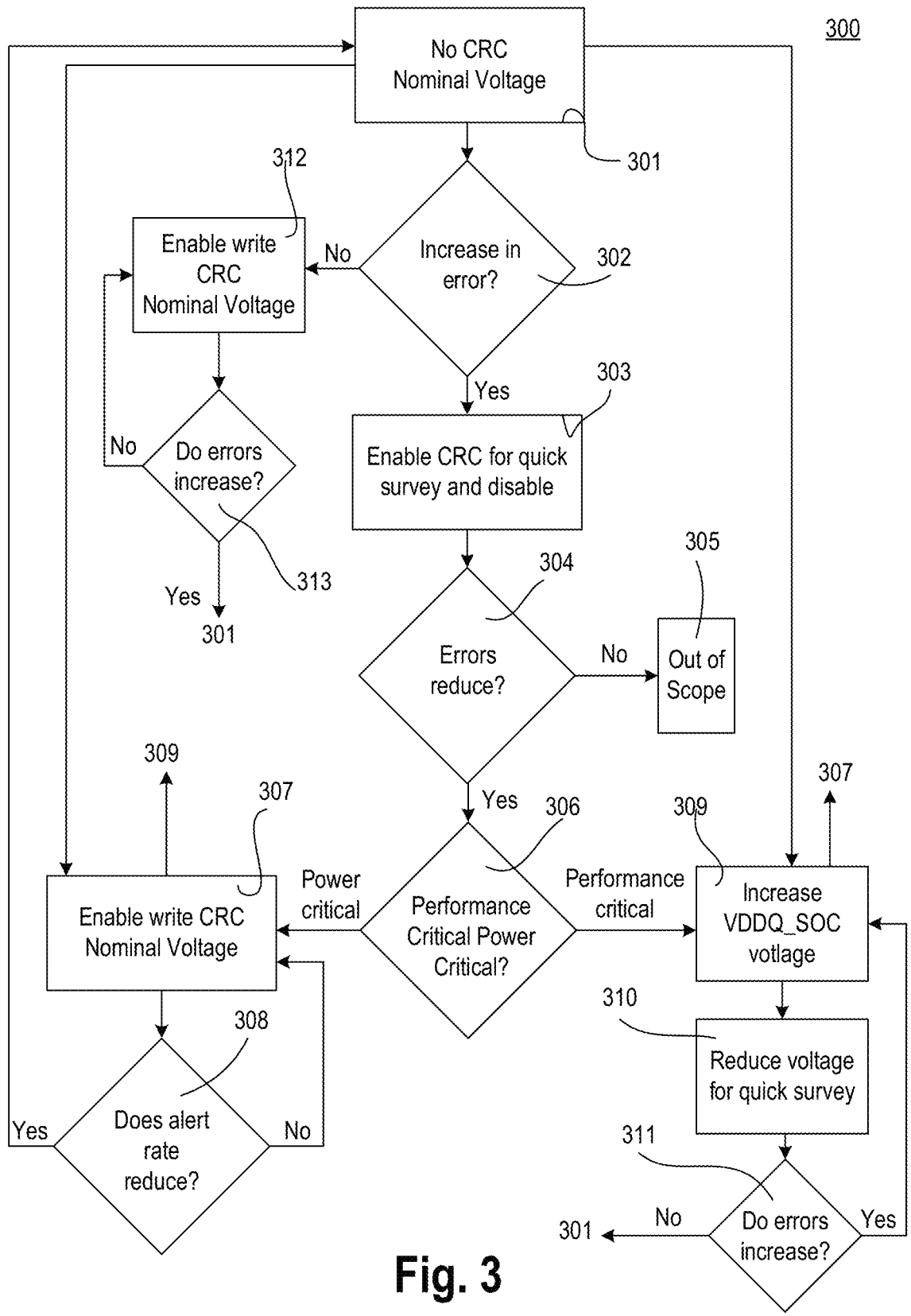
FIG. 3 illustrates a flowchart of a method for dynamic enablement of CRC and/or adjustment of power supply to a memory PHY, in accordance with some embodiments.

FIG. 3 illustrates flowchart 300 of a method for dynamic enablement of CRC and/or adjustment of power supply to a memory PHY, in accordance with some embodiments. While various blocks are illustrated in a particular order, the order can be modified. For example, some blocks may be performed before others, while some block may be performed in parallel or simultaneously. Flowchart 300 can be performed by software, hardware, or a combination of them.

Flowchart 300 begins with block 301 where MC 210 sets VDDQ_SOC to nominal value and CRC (and/or any other error detection/correction scheme) is inactive. At the default state, there is little harmful noise causing transient errors in the DDR link. For example, the number of errors is below a threshold, and may not be activated.

At block 302, a determination is made by MC 210 regarding condition of errors on the DDR link. If the errors are increasing over time (e.g., over a predetermined or programmable time) then the process proceeds to block 303.

Increase in errors can be noticed by one or more mechanisms. In one example, data-mismatch interrupts provide evidence of observable errors in the memory system. In another example, if error correction code (ECC) is enabled, an increase in ECC errors provides evidence of errors on the data link. Other mechanism can also be used to determine increase or decrease in errors on the data retrieved over the data link.

At block 303, MC 210 enables CRC (and/or any other error detection/correction scheme) for quick survey of conditions of error on the data link. CRC may be enabled for few hundred clock cycles and then disabled, in accordance with some embodiments. One reason for temporarily enabling CRC is to check whether the errors are caused by transient link errors. The error rates are recorded. CRC is disabled back again to inactive state as in block 301. The quick survey can also be done by increasing the voltage of VDDA_SOC to see error-rate-modulation. The process then proceeds to block 304.

At block 304, MC 210 decides about the effectiveness of temporarily enabling CRC on the error rate. If the errors increased despite enabling CRC, it may indicate that there may be a more serious problem that needs to be debugged. It may be that the errors are not due to noise causing link errors. For example, the memory be may be corrupt, data transceivers may be malfunctioning etc. In this case, enabling CRC or increasing VDDQ_SOC may not solve the issue of increasing errors. If the errors reduce by the temporary enabling of CRC, then the process proceeds to process 306. Reduction in errors indicate that errors in the data link are due to noise in the data link.

At block 306, MC 210 decides whether SoC 201 prefers power over performance. For example, MC 210 determines whether the memory subsystem is performance-critical or power critical. Here performance refers to bandwidth of the data link. Performance-critical generally means that the system will try to maximize performance, even at the expense of added power consumption. A performance-critical state is trading hours of a stock market, for example. Power-critical generally means that the system will try to minimize power, even though there is a negative impact on performance. A system may change its characteristic from being performance-critical to being power-critical over time. Flowchart 300 considers the dynamic change of performance-critical to power-critical roles and visa-versa in determining whether to enable CRC or increase VDDQ_SOC. If MC 210 determines that the system is power critical, the process proceeds to block 307.

At block 307, MC 210 enables write CRC and sets VDDQ_SOC at nominal voltage. Here, for power-critical systems, write-CRC is enabled which decreases the performance due to additional burst length. In some embodiments, the CRC-alert indication by DRAMs allows the system to retry errored transactions and prevent errors from getting accumulated. The process then proceeds to block 308.

At block 308, MC 210 decides about the alert rate, and whether it reduces. Alert is generated by DRAM 212 when the write-data/CRC on lanes are corrupted due to noise. If the rate of alert signaling by DRAM 212 reduces over time, it indicates that the ambient noise in the system has reduced. If noise reduces, the system can go back to block 301 (optimal state for both performance and power consumption). Otherwise, the system remains in 'Enable write CRC' mode as indicated by block 307.

In some embodiments, when MC 210 determines that the system is power-critical, MC 210 and/or p-unit 208 causes increase in voltage of VDDQ_SOC merely for surveying the error-rate in the system. In case the error rate is high (yes-arrow from block 304) and the system is performance-critical, the system decides to persist with increased voltage regime. This eliminates (or substantially eliminates) the noise interference on data/CRC lines at the cost of higher power consumption, in accordance with some embodiments. The process then proceeds to block 310.

At block 310, MC 210 and/or p-unit 208 causes reduction in voltage of VDDQ_SOC for a quick survey. This process is similar to the process performed by blocks 303 and 304 to gauge the effectiveness of reducing VDDQ_SOC. After a certain time of operation (can be made configurable), the system reduces to voltage of VDDQ_SOC to check whether the system is still under noisy ambience. Here, MC 210 merely wants to check the error rate. Similar checking may not be performed in the power-critical-branch at block 307, in accordance with some embodiments. That is because in CRC-enabled operation, during the operation itself, the alert-rate works as an indicator of noise ambience.

At block 311, MC 210 decides regarding the rate of errors in the data received over the data link. If errors increase, it indicates that the system is still in high-noise zone and the system should continue in high-voltage mode (i.e., block 307). If on other hand, error-rates are no longer high, the system can go back to block 301 (optimal state for both performance and power consumption).

Referring back to block 302, if the number of errors is not increasing, the process proceeds to block 312. At block 312 MC 210 enables write CRC and sets the voltage of VDDQ_SOC at nominal voltage. In some embodiments, for power-critical systems, if errors are not detected by block 302, MC 210 enables write CRC and reduces the voltage level of VDDQ_SOC below nominal voltage. The idea is to compensate the voltage reduction with CRC, so as to save power but can still recover link errors within an "acceptable" threshold. The process then proceeds to block 312. At block 313, a determination is made regarding the error rate. If the errors are increasing in the data on the data link, the process proceeds to block 301 so appropriate actions can be taken through blocks 303 and onwards. Otherwise, the process reverts back to block 312. In some embodiments, alert is generated by DRAM 212 when the write-data/CRC on lanes are corrupted due to noise. If the rate of alert signaling by DRAM 212 increases over time, it indicates that either the ambient noise in system has increased above a threshold or the purpose of block 312 is not working for the workload and/or other system conditions. Hence, the system can go back to block 301 (optimal state for both performance and power consumption). Otherwise, the system remains in 312.

Table 1 illustrates the transitions from blocks 301 to 307, from blocks 301 to 309, transitions from blocks 307 to 309, and transistors from blocks 309 to 307.

TABLE 1

| Edge # | Description |
| --- | --- |
| 301 →307 | In case there is a priori knowledge about increasing noise in power-critical system, MC 210 causes the system to move from block 301 to block 307 without going through blocks 302, 303, 304, 306 (which are noise measuring states). |
| 301 →309 | In case there is a priori knowledge about increasing noise in performance-critical system, MC 201 can cause the system to move from block 301 to block 309 without going through blocks 302, 303, 304, 3066 (which are noise measuring states). One example could be in servers where there is a known time of high-traffic-compute (assume stock-market-peak or black-Friday-peak). In case the systems decide to stay reliably up during the peak time, being ready to take a |

TABLE 1-continued

| Edge # | Description |
| --- | --- |
| | hit of higher power consumption, then the edge from block 301 to block 309 may be advantageous. |
| 307 →309 | During the course of operation in a noisy environment, MC 210 causes the system to transition from power-critical to performance-critical. |
| 309 →307 | During the course of operation in a noisy environment, MC 201 causes the system to transition from performance-critical to power-critical. |

Figure 4:
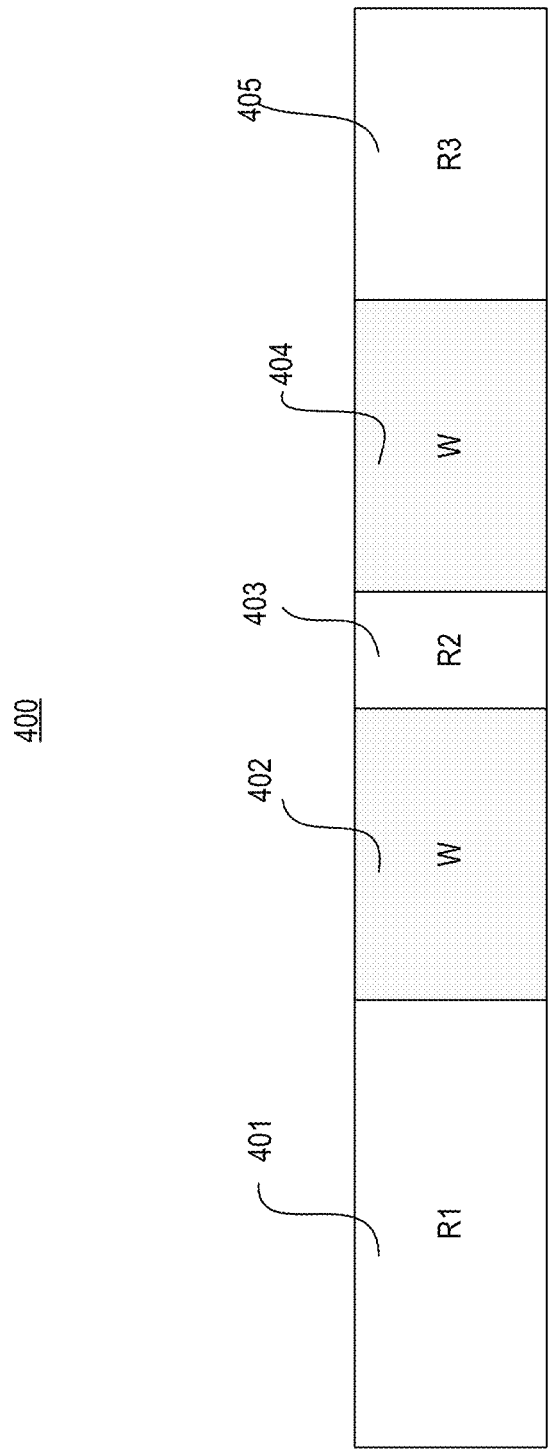
FIG. 4 illustrates a scheduling behavior of a memory controller.

FIG. 4 illustrates scheduling behavior 400 of read and write operations by a memory controller. MC 210 prevents a single DRAM read from alternating with a single DRAM write. As frequent switching between DRAM-read and DRAM-write leads to costly turnaround latencies on DRAM bus (Data link), MC scheduler 210c groups DRAM reads together and also groups DRAM writes together. Here, reads are given higher priority over writes. After a bunch of writes queue up within MC 210, MC scheduler 210c drains the write in a burst. While draining writes, an escape condition is kept for switching to a read in case a high priority read arrives in between requiring immediate servicing (example real-time).

Scheduling behavior 400 shows reads R1 401, R2 403, and R3 405, and writes 402 and 404 in a pipeline. The zones for read R1 401 and R3 405 are grouped together by MC read/write scheduler 201c. Likewise, the zones for writes W 402 and 404 are grouped together. Here, read R2 403 illustrates an escape zone for read from a write zone formed by 402 and 404. The escape zone read is for a short while to honor a limited number of high priority read operations.

Figure 5:
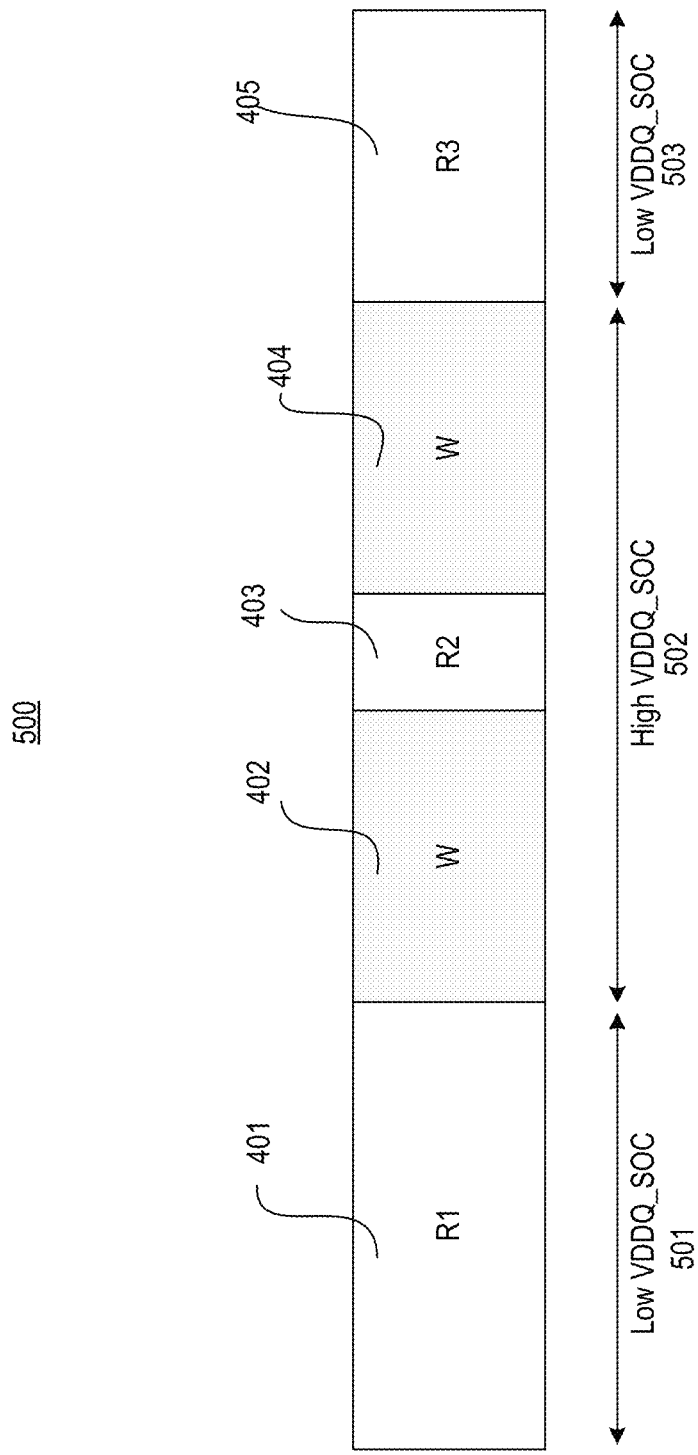
FIG. 5 illustrates a power-aware read-write scheduling scheme by a memory controller, in accordance with some embodiments.

FIG. 5 illustrates a power-aware read-write scheduling scheme 300 by memory controller 210, in accordance with some embodiments. In some embodiments, during R1 401 and R3 405 reads, MC 210 and/or p-unit 208 causes IVR 207 to lower the voltage on VDDQ_SOC rail as indicated by time frames 501 and 503. In some embodiments, during writes W 402 and 404, MC 210 and/or p-unit 208 causes IVR 207 to raise the voltage on VDDQ_SOC relative to a nominal VDDW_SOC voltage. Even though the DRAM VDDQ_SOC voltage rail needs low voltage value as per JEDEC specification, note that for signal integrity and for achieving high speed DRAM bus operation, the high voltage in VDDQ_SOC is helpful.

During R2, the MC makes a short duration escape from writes to allow limited number of high-priority reads to go through. In situations like R2, switching to lower voltage level and back will take more time and can impact the performance. Instead, the voltage is maintained at High-VDDQ_SOC throughout. This will not impact the signal-integrity during read. Moreover, since read R2 403 is of small-duration (e.g., it is just an escape to let limited number of high-priority reads through), the additional power consumption due to read R2 403 will be limited.

Figure 6:
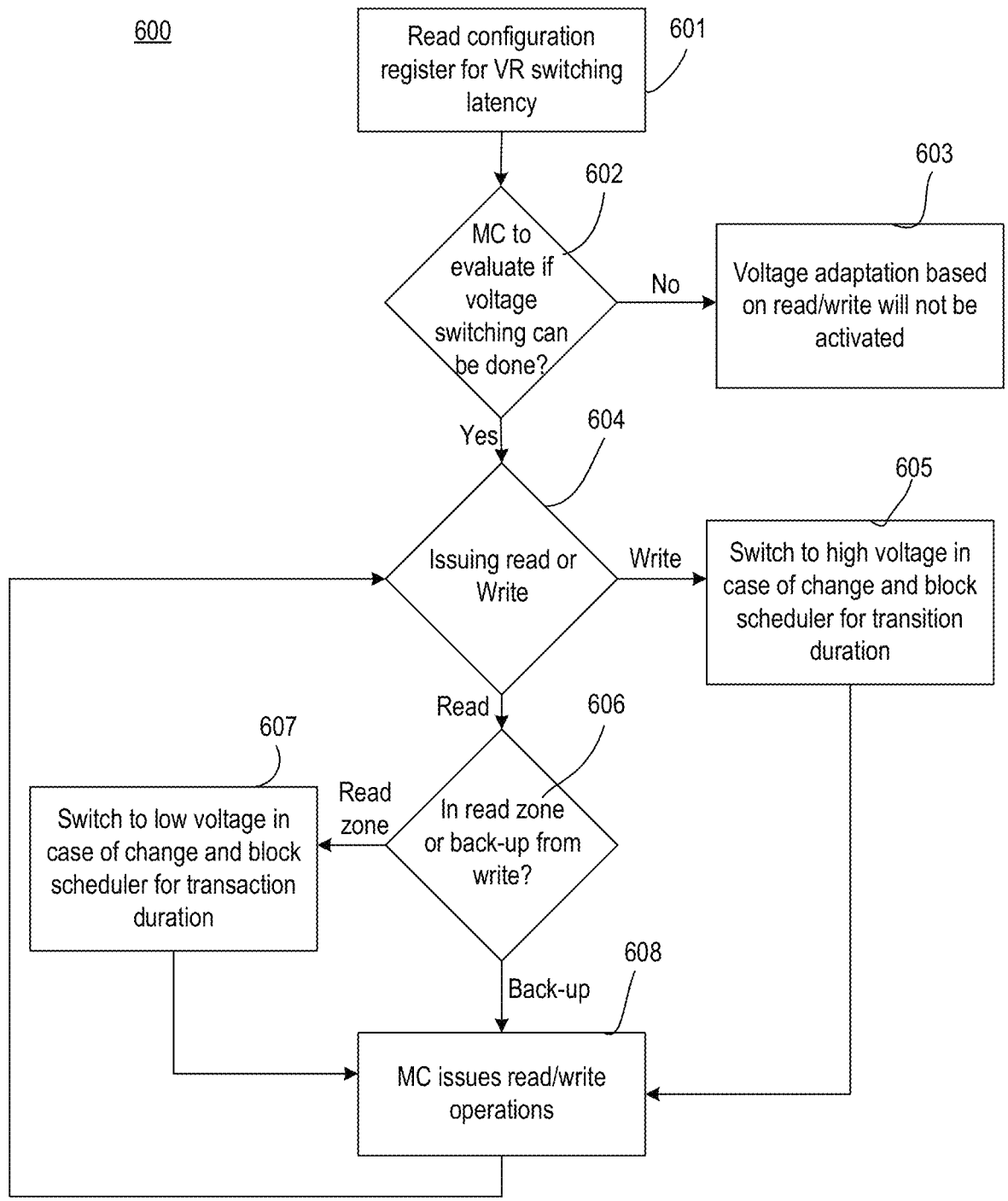
FIG. 6 illustrates a flowchart of a method for dynamic voltage scaling based on read and/or write operations, in accordance with some embodiments.

FIG. 6 illustrates flowchart 600 of a method for dynamic voltage scaling based on read and/or write operations, in accordance with some embodiments. While various blocks are illustrated in a particular order, the order can be modified. For example, some blocks may be performed before others, while some block may be performed in parallel or simultaneously. Flowchart 600 can be performed by software, hardware, or a combination of them.

At block 601, logic 210a of MC 210 reads configuration register for voltage regulator switching latency. Here, regulator switching latency generally refers to an amount of time it takes to change the voltage on an output supply rail. There is a delay from the time that MC signals the voltage-regulator to change the voltage and the changed voltage is seen by DDR PHY, which is referring to as switching latency. In some embodiments, the voltage-regulator is fast enough compared to the read-zone and write-zone durations in the memory controller. If the voltage-regulator-switching-latency is much higher than a typical read-zone or write-zone of the controller, then it may be futile to change voltages in one example. In implementations where the regulator switching latency is higher, MC may also alter the read/write sequence opportunistically to create a continuous-read/write window to enable voltage change. In some embodiments, logic 210a of MC 210 reads configuration register indicating average-continuous-burst-length-duration (ACBLD). ACBLD is a measure of how long the read-zone-duration is without an intervening write-transaction. In some embodiments, the read configuration register indicates the threshold. This threshold indicates when voltage switching in a voltage regulator can happen. For example, the threshold is a voltage regulator switching latency. The process then proceeds to block 602.

At block 602, MC 210 evaluates if voltage switching can be done. For example, MC 210 determines whether VDDQ_SOC can be increased or lowered to optimize power and/or performance for read and/or write operations. In some embodiments, MC 210 checks whether ACBLD or voltage-switching-latency (VSL) is greater than the threshold read from the read configuration register. In some embodiments, the threshold is programmable based on power-performance trade-off. For example, if ACBLD is almost equal or less than VSL, there may be a penalty in the form of scheduler-block in comparison to total time of traffic. In such conditions, it may not be advisable to turn on the voltage-switching feature. This is indicated by block 603 where MC 210 and/or p-unit 208 do not activate voltage switching based on read/write operations. In this case, VDDQ_SOC remains at nominal voltage level for both read and write operations.

On other hand if the ACBLD is much greater than VSL, the penalty of scheduler-block is negligible in comparison to total time of traffic. During voltage switching latency (VSL), the transactions through the scheduler are blocked. If ACBLD, which is considered the productive time when transactions do happen to the DRAM, is higher than VSL, then number of transactions are much higher than the number of transactions blocked due to VSL. Hence, the penalty of scheduler-block is negligible in this context. In such conditions it may be advisable to use the voltage-switching-feature, and the process proceeds to block 604.

At block 604, MC 210 determines whether scheduler 210c is issuing a read or write operation. The read and/or write indication is used to determine whether the voltage VDDQ_SOC will be driven lower or higher. If MC 210 determines that scheduler 210c is issuing a write operation, the process proceeds to block 605. At block 605, MC 210 and/or p-unit 208 causes IVR 207 to increase VDDQ_SOC relative to a nominal voltage. For write operations, the VDDQ_SOC is raised to prevent signal-integrity issues on the data link. Also, blocking scheduler 210c during voltage-switching-time is may be useful because during this duration any transaction sent towards DRAM 212 may be corrupted due to undefined-transitioning-voltage on the VDDQ_SOC rail. the process then proceeds to block 608 where MC 210 issues the write operation. For example, after the voltage switching (e.g., increasing VDDQ_SOC for upcoming write operation) is complete and a stable-appropriate-voltage is achieved for VDDQ_SOC, the write operation is undertaken. The process then proceeds to block 604.

At block 604, if MC 210 determines that scheduler 210c is issuing a read operation, the process proceeds to block 606. At block 606, MC 210 and/or scheduler 201c determines whether scheduler 210c is in read-zone or back-up from write. Here, read-zone (e.g., zones 401 and 405) is a zone where there is a sustained long sequence of read operations. Conversely, back-up from write refers to a limited number of high-priority reads that are going to be issued following reversal to write-sequence. Back-up is typically done to allow starved high-priority reads to pass through selectively. One such scenario is illustrated by read R2 403 between writes 402 and 404. If MC 210 and/or scheduler 201c determines that the read is within the read-zone then the process proceeds to block 607.

At block 607, MC 210 and/or p-unit 208 instructs IVR 207 to reads VDDQ_SOC (e.g., switch from high or nominal VDDQ_SOC to low VDDQ_SOC). For reads, the VDDQ_SOC is lowered to a level as allowed by the JEDEC specification. In some embodiments, MC 210 blocks scheduler 210c during voltage-switching-time (e.g., time when VDDQ_SOC is being adjusted). Scheduler 210c is blocked because during the voltage-switching-time, any transaction sent towards DRAM 212 may be corrupted due to undefined-transitioning-voltage on VDDQ_SOC rail. Power is propositional to $V^2$. Power consumed has square relationship to voltage, hence reducing voltage during reads results in significant power savings. Using this relationship, a reduction in voltage from 1.1V to 0.6V, has approximately 70% power reduction in VDDQ_SOC-rail-power during reads.

In various embodiments, DDR PHY 211 includes three power supply rails—VDD, VAA, and VDDQ_SOC. VDD is a power supply for the digital circuits of DDR PHY 211. VAA is the analog rail for DDR PHY 211. VDDQ_SOC is the pre-driver power supply rail. In some embodiments, p-unit 108 and/or MC 210 does not change voltages of all these power supply rails in DDR PHY 211. In some embodiments, p-unit 108 and/or MC 210 adjusts some or all voltages of the three power supply rails.

The process then proceeds to block 608, where MC 210 issues the read operation. For example, after the voltage switching (e.g., lowering of VDDQ_SOC for upcoming read operation) is complete and a stable-appropriate-voltage is achieved for VDDQ_SOC, the read operation is undertaken. The process then proceeds to block 604. If MC 210 and/or scheduler 201c determines that the read is back-up from write (e.g., a high-priority read) then the process proceeds to block 608, where MC 210 issues the read operation with high VDDQ_SOC (like for write).

In some embodiments, switching time of IVR 207 plays role in the decision by p-unit 208 and/or MC 210 to reduce or increase the voltage of VDDQ_SOC for reads and writes respectively as discussed with reference to block 602. The faster switching times of IVR 207 enables the p-unit 208 to reduce the voltage of VDDQ_SOC for reads more frequently and hence more power savings. For better performance and power savings, having IVR 207 that can switch between low, high, and nominal VDDQ_SOC voltages is helpful. In some embodiments, IVR 207 is implemented as a digital LDO which has faster response to adjust or switch voltage levels that traditional DC-DC converter.

In some embodiments, a digital integrated voltage regulator is used to provide fast adjustment to VDDQ_SOC. For instance, a digital integrated voltage regulator can dynamically switch voltage range of 0.5V in order of 30 ns (approximately), depending on the technology features implemented. In some embodiments, IVR 208 implements a power multiplexer that can provide faster voltage switching speeds.

Figure 7:
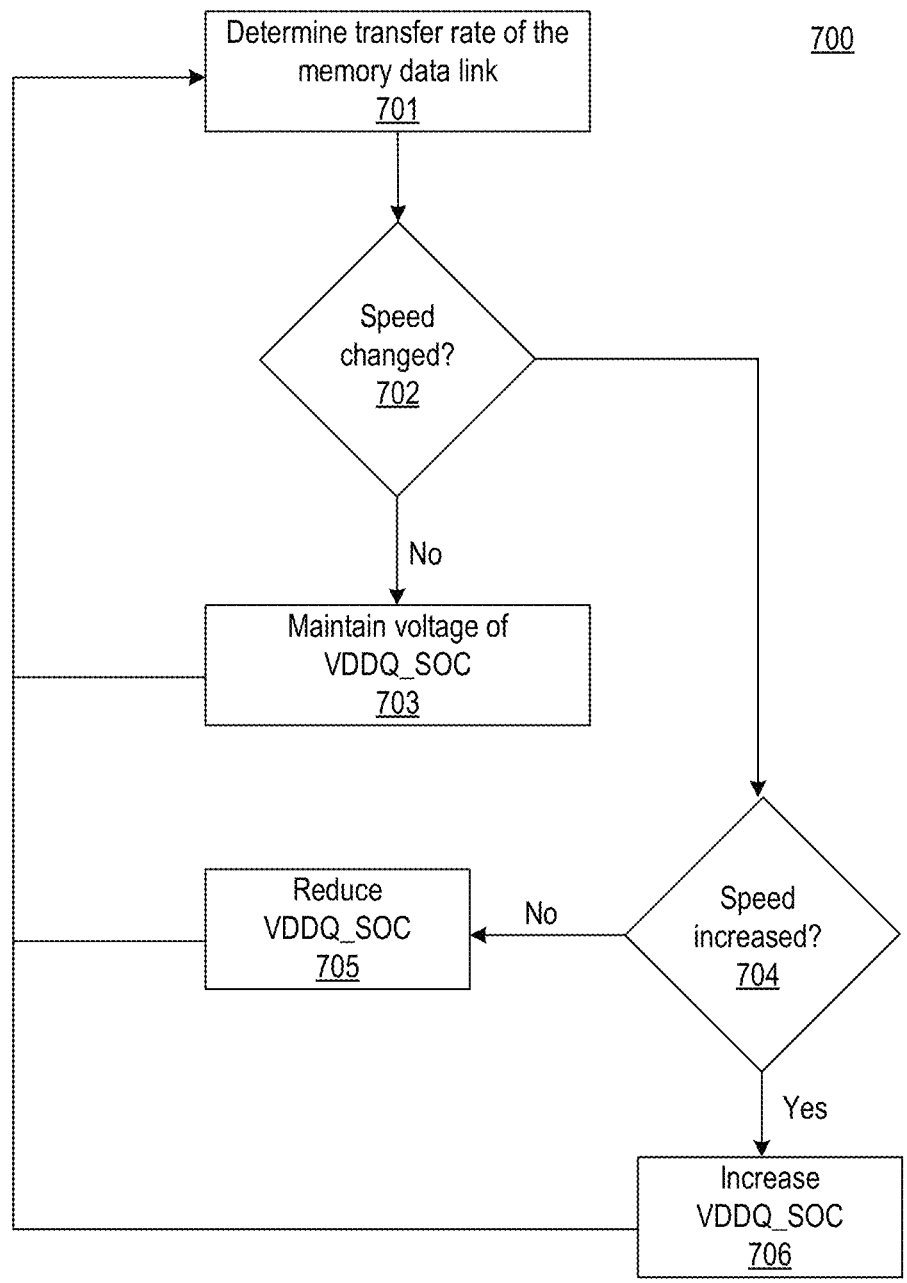
FIG. 7 illustrates flowchart of a method for dynamic voltage scaling based on speed of the memory data link, in accordance with some embodiments.

FIG. 7 illustrates flowchart 700 of a method for dynamic voltage scaling based on speed of the memory data link, in accordance with some embodiments. While various blocks are illustrated in a particular order, the order can be modified. For example, some blocks may be performed before others, while some block may be performed in parallel or simultaneously. Flowchart 700 can be performed by hardware, software, or a combination of hardware and software.

At block 701, MC 210 determines the transfer rate of memory data link by DDR_PHY 211. Traditionally, SoC driving data to DRAM 212, the voltage of VDDQ_SOC is kept at required constant for various operating frequencies. While processor cores have limited dynamic voltage and frequency scaling where supply voltage is adjusted according to frequency of operation, memory transfer links have kept the supply voltage to DDR pre-driver at fixed levels to meet the high speed of the data link. For example, for transfer rate of 4267 MT/s, VDDQ_SOC is kept at 1.1V. In other words, VDDQ_SOC in traditional systems is not a dynamically adjustable voltage rail. In various embodiments, depending on the desired speed of operation of DDR_PHY 211, MC 210 and/or p-unit 208 cause IVR 207 to adjust VDDQ_SOC to achieve the optimal power consumption.

At block 702, MC 210 determines the transfer rate of DDR_PHY 211. If the transfer rate or speed does not change the process proceeds to block 703, where the previous or current VDDQ_SOC voltage level is maintained, and the process proceeds to block 701. If the transfer rate or speed does change, the process proceeds to block 704. At block 704, MC 210 determines whether the transfer rate or speed increased. If the transfer rate or speed increases, MC 210 decides whether to increase VDDQ_SOC. In one example, if the speed of the data link increased to 3200 MT/s, VDDQ_SOC is kept at 0.6V. If the speed of the data link increased to 3733 MT/s, MC 210 and/or p-unit 208 instructs IVR 207 to increase the voltage on the VDDQ_SOC rail to 0.9V to meet signal integrity requirements. In another example, if the speed increases to 4267 MT/s, MC 210 and/or p-unit 208 instructs IVR 207 to increase the voltage on the VDDQ_SOC rail to 1.1V to meet signal integrity requirements. The increase in VDDQ_SOC is done at a rate that does not cause overshoot and/or undershoot on VDDQ_SOC. If the speed of the data link did not increase (e.g., it decreased), then the process proceeds to block 705. At block 705, MC 210 and/or p-unit 208 instructs IVR 207 to reduce VDDQ_SOC so long as the errors from noise on the data link are within an acceptable threshold. The decrease in VDDQ_SOC is done at a rate that does not cause overshoot and/or undershoot on VDDQ_SOC.

In some embodiments, the various logic blocks of MC 210 and/or SoC 201 are coupled together via a Network Bus. Any suitable protocol may be used to implement the network bus. In some embodiments, machine-readable storage medium includes instructions (also referred to as the program software code/instructions) for calculating or measuring distance and relative orientation of a device with reference to another device as described with reference to various embodiments and flowchart.

Program software code/instructions associated with various embodiments executed to implement embodiments of the disclosed subject matter may be implemented as part of an operating system or a specific application, component, program, object, module, routine, or other sequence of instructions or organization of sequences of instructions referred to as "program software code/instructions," "operating system program software code/instructions," "application program software code/instructions," or simply "software" or firmware embedded in processor. In some embodiments, the program software code/instructions associated with various embodiments are executed by system.

In some embodiments, the program software code/instructions associated with various embodiments are stored in a computer executable storage medium and executed by the processor. Here, computer executable storage medium is a tangible machine-readable medium that can be used to store program software code/instructions and data that, when executed by a computing device, causes one or more processors to perform a method(s) as may be recited in one or more accompanying claims directed to the disclosed subject matter.

The tangible machine-readable medium may include storage of the executable software program code/instructions and data in various tangible locations, including for example ROM, volatile RAM, non-volatile memory and/or cache and/or other tangible memory as referenced in the present application. Portions of this program software code/instructions and/or data may be stored in any one of these storage and memory devices. Further, the program software code/instructions can be obtained from other storage, including, e.g., through centralized servers or peer to peer networks and the like, including the Internet. Different portions of the software program code/instructions and data can be obtained at different times and in different communication sessions or in the same communication session.

The software program code/instructions, associated with various embodiments, and data can be obtained in their entirety prior to the execution of a respective software program or application by the computing device. Alternatively, portions of the software program code/instructions and data can be obtained dynamically, e.g., just in time, when needed for execution. Alternatively, some combination of these ways of obtaining the software program code/instructions and data may occur, e.g., for different applications, components, programs, objects, modules, routines or other sequences of instructions or organization of sequences of instructions, by way of example. Thus, it is not required that the data and instructions be on a tangible machine readable medium in entirety at a particular instance of time.

Examples of tangible computer-readable media include but are not limited to recordable and non-recordable type media such as volatile and non-volatile memory devices, read only memory (ROM), random access memory (RAM), flash memory devices, floppy and other removable disks, magnetic storage media, optical storage media (e.g., Compact Disk Read-Only Memory (CD ROMS), Digital Versatile Disks (DVDs), etc.), ferroelectric memory, resistive RAM, phase change memory (PCM), magnetic RAM (MRAM, among others. The software program code/instructions may be temporarily stored in digital tangible communication links while implementing electrical, optical, acoustical or other forms of propagating signals, such as carrier waves, infrared signals, digital signals, etc. through such tangible communication links.

In general, tangible machine readable medium includes any tangible mechanism that provides (i.e., stores and/or transmits in digital form, e.g., data packets) information in a form accessible by a machine (i.e., a computing device), which may be included, e.g., in a communication device, a computing device, a network device, a personal digital assistant, a manufacturing tool, a mobile communication device, whether or not able to download and run applications and subsidized applications from the communication network, such as the Internet, e.g., an iPhone®, Galaxy®, or the like, or any other device including a computing device. In one embodiment, processor-based system is in a form of or included within a PDA (personal digital assistant), a cellular phone, a notebook computer, a tablet, a game console, a set top box, an embedded system, a TV (television), a personal desktop computer, etc. Alternatively, the traditional communication applications and subsidized application(s) may be used in some embodiments of the disclosed subject matter.

Figure 8:
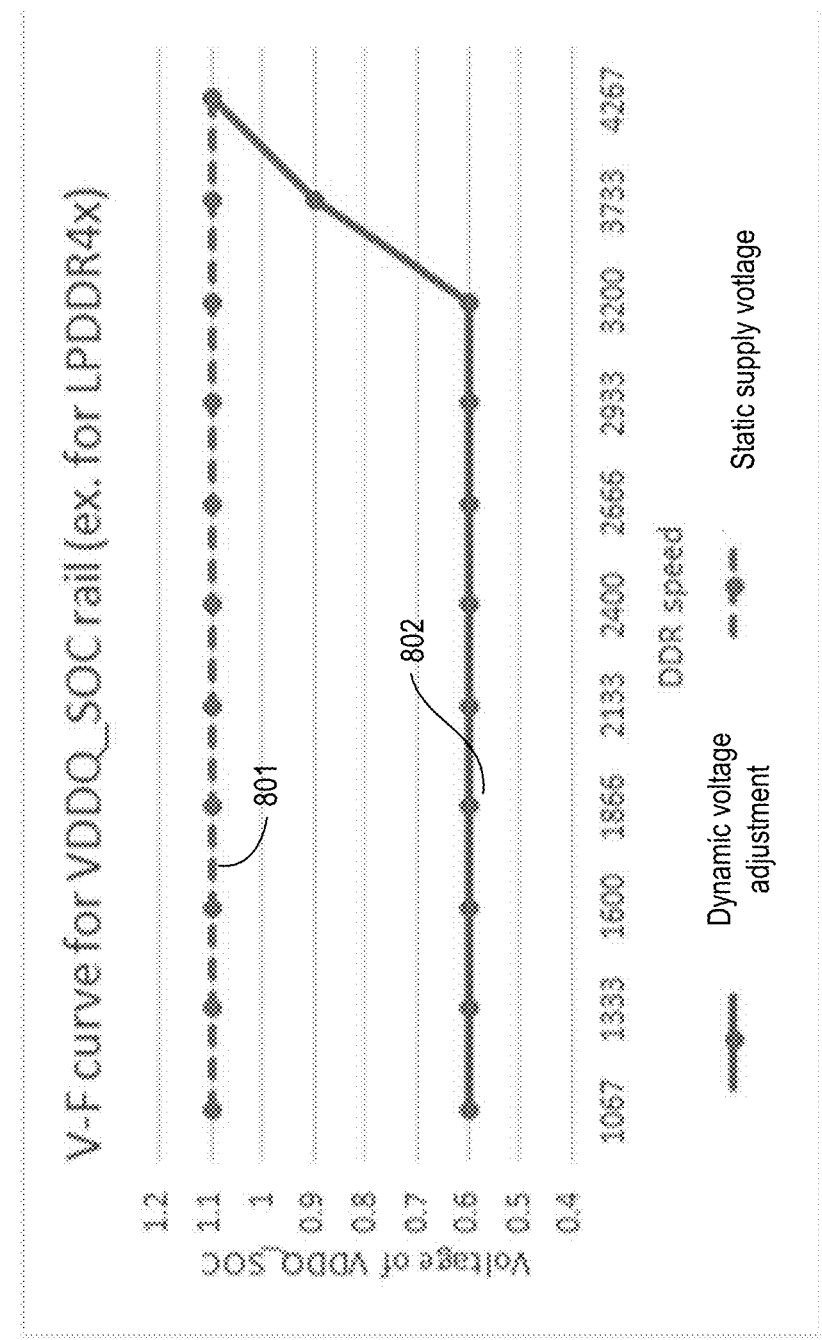
FIG. 8 illustrates a plot showing dynamic adjustment of VDDQ_SOC according to speed of the data link, in accordance with some embodiments.

FIG. 8 illustrates plot 800 showing dynamic adjustment of VDDQ_SOC according to speed of the data link, in accordance with some embodiments. Here, data points 801 are the traditional usage of VDDQ_SOC, which is static regardless of data link transfer rate. The voltage level of VDDQ_SOC is set to provide support for the highest transfer rate for the process technology node and memory IO interface. Data points 802 show the adjustable VDDQ_SOC in accordance with some embodiments. As can be seen, except for highest speed 4267 MT/s, the voltage on VDDQ_SOC can be reduced for other speeds resulting is power savings.

Figure 9:
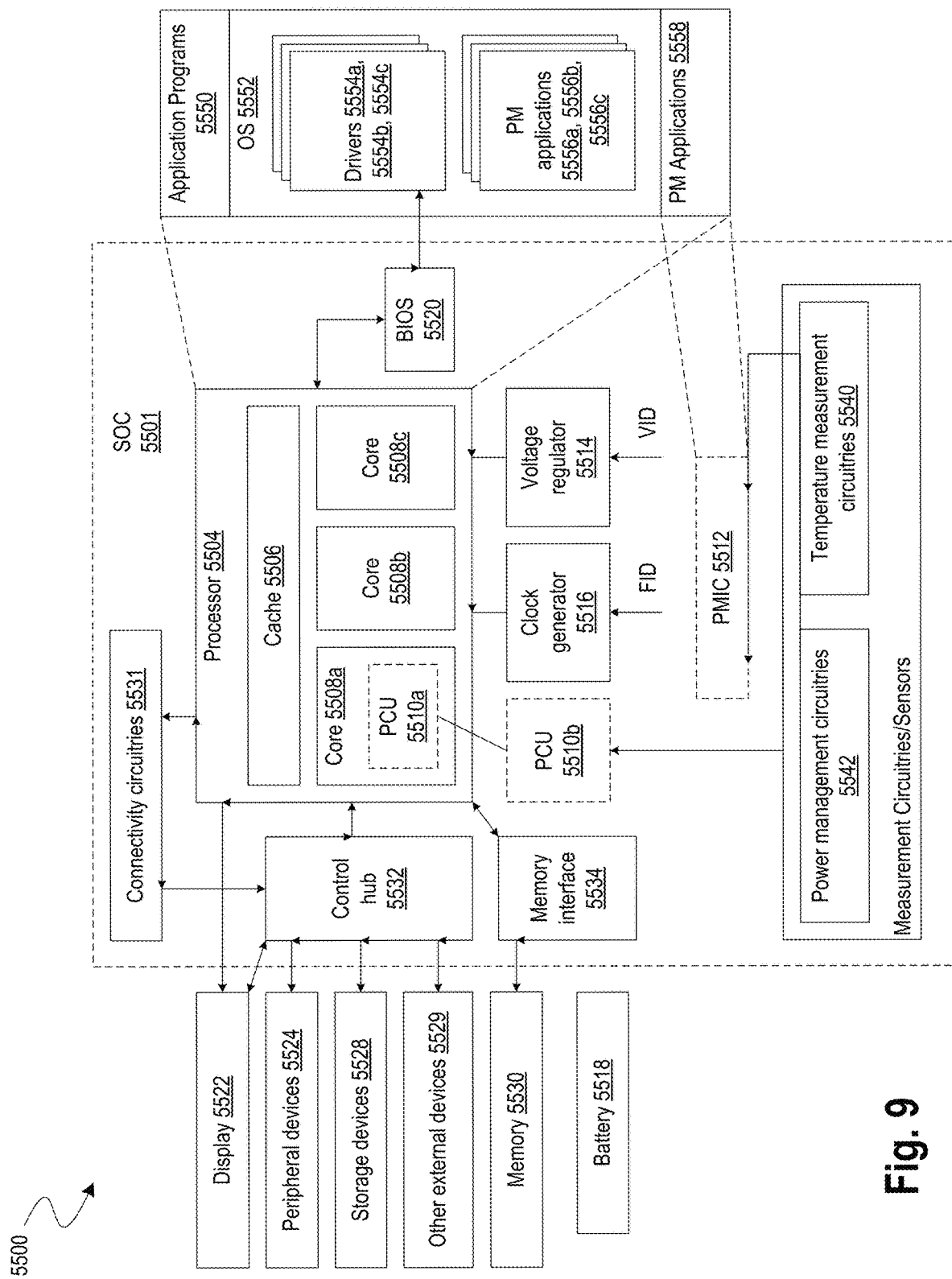
FIG. 9 illustrates a smart device or a computer system or an SoC (System-on-Chip) with hardware and/or software to optimize power and/or performance of a memory subsystem, in accordance with some embodiments.

FIG. 9 illustrates a smart device or a computer system or an SoC (System-on-Chip) with hardware and/or software to optimize power and/or performance of a memory subsystem, in accordance with some embodiments. It is pointed out that those elements of FIG. 9 having the same reference numbers (or names) as the elements of any other figure may operate or function in any manner similar to that described, but are not limited to such. Any block in this smart device can have the apparatus for dynamically optimizing battery charging voltage.

In some embodiments, device 5500 represents an appropriate computing device, such as a computing tablet, a mobile phone or smart-phone, a laptop, a desktop, an Internet-of-Things (IOT) device, a server, a wearable device, a set-top box, a wireless-enabled e-reader, or the like. It will be understood that certain components are shown generally, and not all components of such a device are shown in device 5500.

In an example, the device 5500 comprises an SoC (System-on-Chip) 5501. An example boundary of the SoC 5501 is illustrated using dotted lines in FIG. 9, with some example components being illustrated to be included within SoC 5501—however, SoC 5501 may include any appropriate components of device 5500.

In some embodiments, device 5500 includes processor 5504. Processor 5504 can include one or more physical devices, such as microprocessors, application processors, microcontrollers, programmable logic devices, processing cores, or other processing implementations such as disaggregated combinations of multiple compute, graphics, accelerator, I/O and/or other processing chips. The processing operations performed by processor 5504 include the execution of an operating platform or operating system on which applications and/or device functions are executed. The processing operations include operations related to I/O (input/output) with a human user or with other devices, operations related to power management, operations related to connecting computing device 5500 to another device, and/or the like. The processing operations may also include operations related to audio I/O and/or display I/O.

In some embodiments, processor 5504 includes multiple processing cores (also referred to as cores) 5508a, 5508b, 5508c. Although merely three cores 5508a, 5508b, 5508c are illustrated in FIG. 9, processor 5504 may include any other appropriate number of processing cores, e.g., tens, or even hundreds of processing cores. Processor cores 5508a, 5508b, 5508c may be implemented on a single integrated circuit (IC) chip. Moreover, the chip may include one or more shared and/or private caches, buses or interconnections, graphics and/or memory controllers, or other components.

In some embodiments, processor 5504 includes cache 5506. In an example, sections of cache 5506 may be dedicated to individual cores 5508 (e.g., a first section of cache 5506 dedicated to core 5508a, a second section of cache 5506 dedicated to core 5508b, and so on). In an example, one or more sections of cache 5506 may be shared among two or more of cores 5508. Cache 5506 may be split in different levels, e.g., level 1 (L1) cache, level 2 (L2) cache, level 3 (L3) cache, etc.

In some embodiments, processor core 5504 may include a fetch unit to fetch instructions (including instructions with conditional branches) for execution by the core 5504. The instructions may be fetched from any storage devices such as the memory 5530. Processor core 5504 may also include a decode unit to decode the fetched instruction. For example, the decode unit may decode the fetched instruction into a plurality of micro-operations. Processor core 5504 may include a schedule unit to perform various operations associated with storing decoded instructions. For example, the schedule unit may hold data from the decode unit until the instructions are ready for dispatch, e.g., until all source values of a decoded instruction become available. In one embodiment, the schedule unit may schedule and/or issue (or dispatch) decoded instructions to an execution unit for execution.

The execution unit may execute the dispatched instructions after they are decoded (e.g., by the decode unit) and dispatched (e.g., by the schedule unit). In an embodiment, the execution unit may include more than one execution unit (such as an imaging computational unit, a graphics computational unit, a general-purpose computational unit, etc.). The execution unit may also perform various arithmetic operations such as addition, subtraction, multiplication, and/or division, and may include one or more an arithmetic logic units (ALUs). In an embodiment, a co-processor (not shown) may perform various arithmetic operations in conjunction with the execution unit.

Further, execution unit may execute instructions out-of-order. Hence, processor core 5504 may be an out-of-order processor core in one embodiment. Processor core 5504 may also include a retirement unit. The retirement unit may retire executed instructions after they are committed. In an embodiment, retirement of the executed instructions may result in processor state being committed from the execution of the instructions, physical registers used by the instructions being de-allocated, etc. Processor core 5504 may also include a bus unit to enable communication between components of processor core 5504 and other components via one or more buses. Processor core 5504 may also include one or more registers to store data accessed by various components of the core 5504 (such as values related to assigned app priorities and/or sub-system states (modes) association.

In some embodiments, device 5500 comprises connectivity circuitries 5531. For example, connectivity circuitries 5531 includes hardware devices (e.g., wireless and/or wired connectors and communication hardware) and/or software components (e.g., drivers, protocol stacks), e.g., to enable device 5500 to communicate with external devices. Device 5500 may be separate from the external devices, such as other computing devices, wireless access points or base stations, etc.

In an example, connectivity circuitries 5531 may include multiple different types of connectivity. To generalize, the connectivity circuitries 5531 may include cellular connectivity circuitries, wireless connectivity circuitries, etc. Cellular connectivity circuitries of connectivity circuitries 5531 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. Wireless connectivity circuitries (or wireless interface) of the connectivity circuitries 5531 refers to wireless connectivity that is not cellular, and can include personal area networks (such as Bluetooth, Near Field, etc.), local area networks (such as Wi-Fi), and/or wide area networks, and/or other wireless communication. In an example, connectivity circuitries 5531 may include a network interface, such as a wired or wireless interface, e.g., so that a system embodiment may be incorporated into a wireless device, for example, a cell phone or personal digital assistant.

In some embodiments, device 5500 comprises control hub 5532, which represents hardware devices and/or software components related to interaction with one or more I/O devices. For example, processor 5504 may communicate with one or more of display 5522, one or more peripheral devices 5524, storage devices 5528, one or more other external devices 5529, etc., via control hub 5532. Control hub 5532 may be a chipset, a Platform Control Hub (PCH), and/or the like.

For example, control hub 5532 illustrates one or more connection points for additional devices that connect to device 5500, e.g., through which a user might interact with the system. For example, devices (e.g., devices 5529) that can be attached to device 5500 include microphone devices, speaker or stereo systems, audio devices, video systems or other display devices, keyboard or keypad devices, or other I/O devices for use with specific applications such as card readers or other devices.

As mentioned above, control hub 5532 can interact with audio devices, display 5522, etc. For example, input through a microphone or other audio device can provide input or commands for one or more applications or functions of device 5500. Additionally, audio output can be provided instead of, or in addition to display output. In another example, if display 5522 includes a touch screen, display 5522 also acts as an input device, which can be at least partially managed by control hub 5532. There can also be additional buttons or switches on computing device 5500 to provide I/O functions managed by control hub 5532. In one embodiment, control hub 5532 manages devices such as accelerometers, cameras, light sensors or other environmental sensors, or other hardware that can be included in device 5500. The input can be part of direct user interaction, as well as providing environmental input to the system to influence its operations (such as filtering for noise, adjusting displays for brightness detection, applying a flash for a camera, or other features).

In some embodiments, control hub 5532 may couple to various devices using any appropriate communication protocol, e.g., PCIe (Peripheral Component Interconnect Express), USB (Universal Serial Bus), Thunderbolt, High Definition Multimedia Interface (HDMI), Firewire, etc.

In some embodiments, display 5522 represents hardware (e.g., display devices) and software (e.g., drivers) components that provide a visual and/or tactile display for a user to interact with device 5500. Display 5522 may include a display interface, a display screen, and/or hardware device used to provide a display to a user. In some embodiments, display 5522 includes a touch screen (or touch pad) device that provides both output and input to a user. In an example, display 5522 may communicate directly with the processor 5504. Display 5522 can be one or more of an internal display device, as in a mobile electronic device or a laptop device or an external display device attached via a display interface (e.g., DisplayPort, etc.). In one embodiment display 5522 can be a head mounted display (HMD) such as a stereoscopic display device for use in virtual reality (VR) applications or augmented reality (AR) applications.

In some embodiments, and although not illustrated in the figure, in addition to (or instead of) processor 5504, device 5500 may include Graphics Processing Unit (GPU) comprising one or more graphics processing cores, which may control one or more aspects of displaying contents on display 5522.

Control hub 5532 (or platform controller hub) may include hardware interfaces and connectors, as well as software components (e.g., drivers, protocol stacks) to make peripheral connections, e.g., to peripheral devices 5524.

It will be understood that device 5500 could both be a peripheral device to other computing devices, as well as have peripheral devices connected to it. Device 5500 may have a "docking" connector to connect to other computing devices for purposes such as managing (e.g., downloading and/or uploading, changing, synchronizing) content on device 5500. Additionally, a docking connector can allow device 5500 to connect to certain peripherals that allow computing device 5500 to control content output, for example, to audiovisual or other systems.

In addition to a proprietary docking connector or other proprietary connection hardware, device 5500 can make peripheral connections via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, connectivity circuitries 5531 may be coupled to control hub 5532, e.g., in addition to, or instead of, being coupled directly to the processor 5504. In some embodiments, display 5522 may be coupled to control hub 5532, e.g., in addition to, or instead of, being coupled directly to processor 5504.

In some embodiments, device 5500 comprises memory 5530 coupled to processor 5504 via memory interface 5534. Memory 5530 includes memory devices for storing information in device 5500.

In some embodiments, memory 5530 includes apparatus to maintain stable clocking as described with reference to various embodiments. Memory can include nonvolatile (state does not change if power to the memory device is interrupted) and/or volatile (state is indeterminate if power to the memory device is interrupted) memory devices. Memory device 5530 can be a dynamic random-access memory (DRAM) device, a static random-access memory (SRAM) device, flash memory device, phase-change memory device, or some other memory device having suitable performance to serve as process memory. In one embodiment, memory 5530 can operate as system memory for device 5500, to store data and instructions for use when the one or more processors 5504 executes an application or process. Memory 5530 can store application data, user data, music, photos, documents, or other data, as well as system data (whether long-term or temporary) related to the execution of the applications and functions of device 5500.

Elements of various embodiments and examples are also provided as a machine-readable medium (e.g., memory 5530) for storing the computer-executable instructions (e.g., instructions to implement any other processes discussed herein). The machine-readable medium (e.g., memory 5530) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, device 5500 comprises temperature measurement circuitries 5540, e.g., for measuring temperature of various components of device 5500. In an example, temperature measurement circuitries 5540 may be embedded, or coupled or attached to various components, whose temperature are to be measured and monitored. For example, temperature measurement circuitries 5540 may measure temperature of (or within) one or more of cores 5508a, 5508b, 5508c, voltage regulator 5514, memory 5530, a mother-board of SoC 5501, and/or any appropriate component of device 5500. In some embodiments, temperature measurement circuitries 5540 include a low power hybrid reverse (LPHR) bandgap reference (BGR) and digital temperature sensor (DTS), which utilizes subthreshold metal oxide semiconductor (MOS) transistor and the PNP parasitic Bi-polar Junction Transistor (BJT) device to form a reverse BGR that serves as the base for configurable BGR or DTS operating modes. The LPHR architecture uses low-cost MOS transistors and the standard parasitic PNP device. Based on a reverse bandgap voltage, the LPHR can work as a configurable BGR. By comparing the configurable BGR with the scaled base-emitter voltage, the circuit can also perform as a DTS with a linear transfer function with single-temperature trim for high accuracy.

In some embodiments, device 5500 comprises power measurement circuitries 5542, e.g., for measuring power consumed by one or more components of the device 5500. In an example, in addition to, or instead of, measuring power, the power measurement circuitries 5542 may measure voltage and/or current. In an example, the power measurement circuitries 5542 may be embedded, or coupled or attached to various components, whose power, voltage, and/or current consumption are to be measured and monitored. For example, power measurement circuitries 5542 may measure power, current and/or voltage supplied by one or more voltage regulators 5514, power supplied to SoC 5501, power supplied to device 5500, power consumed by processor 5504 (or any other component) of device 5500, etc.

In some embodiments, device 5500 comprises one or more voltage regulator circuitries, generally referred to as voltage regulator (VR) 5514. VR 5514 generates signals at appropriate voltage levels, which may be supplied to operate any appropriate components of the device 5500. Merely as an example, VR 5514 is illustrated to be supplying signals to processor 5504 of device 5500. In some embodiments, VR 5514 receives one or more Voltage Identification (VID) signals, and generates the voltage signal at an appropriate level, based on the VID signals. Various type of VRs may be utilized for the VR 5514. For example, VR 5514 may include a "buck" VR, "boost" VR, a combination of buck and boost VRs, low dropout (LDO) regulators, switching DC-DC regulators, constant-on-time controller-based DC-DC regulator, etc. Buck VR is generally used in power delivery applications in which an input voltage needs to be transformed to an output voltage in a ratio that is smaller than unity. Boost VR is generally used in power delivery applications in which an input voltage needs to be transformed to an output voltage in a ratio that is larger than unity. In some embodiments, each processor core has its own VR, which is controlled by PCU 5510a/b and/or PMIC 5512. In some embodiments, each core has a network of distributed LDOs to provide efficient control for power management. The LDOs can be digital, analog, or a combination of digital or analog LDOs. In some embodiments, VR 5514 includes current tracking apparatus to measure current through power supply rail(s).

In some embodiments, VR 5514 includes a digital control scheme to manage states of a proportional-integral-derivative (PID) filter (also known as a digital Type-III compensator). The digital control scheme controls the integrator of the PID filter to implement non-linear control of saturating the duty cycle during which the proportional and derivative terms of the PID are set to 0 while the integrator and its internal states (previous values or memory) is set to a duty cycle that is the sum of the current nominal duty cycle plus a deltaD. The deltaD is the maximum duty cycle increment that is used to regulate a voltage regulator from ICCmin to ICCmax and is a configuration register that can be set post silicon. A state machine moves from a non-linear all ON state (which brings the output voltage Vout back to a regulation window) to an open loop duty cycle which maintains the output voltage slightly higher than the required reference voltage Vref. After a certain period in this state of open loop at the commanded duty cycle, the state machine then ramps down the open loop duty cycle value until the output voltage is close to the Vref commanded. As such, output chatter on the output supply from VR 5514 is completely eliminated (or substantially eliminated) and there is merely a single undershoot transition which could lead to a guaranteed Vmin based on a comparator delay and the di/dt of the load with the available output decoupling capacitance.

In some embodiments, VR 5514 includes a separate self-start controller, which is functional without fuse and/or trim information. The self-start controller protects VR 5514 against large inrush currents and voltage overshoots, while being capable of following a variable VID (voltage identification) reference ramp imposed by the system. In some embodiments, the self-start controller uses a relaxation oscillator built into the controller to set the switching frequency of the buck converter. The oscillator can be initialized using either a clock or current reference to be close to a desired operating frequency. The output of VR 5514 is coupled weakly to the oscillator to set the duty cycle for closed loop operation. The controller is naturally biased such that the output voltage is always slightly higher than the set point, eliminating the need for any process, voltage, and/or temperature (PVT) imposed trims.

In some embodiments, device 5500 comprises one or more clock generator circuitries, generally referred to as clock generator 5516. Clock generator 5516 generates clock signals at appropriate frequency levels, which may be supplied to any appropriate components of device 5500. Merely as an example, clock generator 5516 is illustrated to be supplying clock signals to processor 5504 of device 5500. In some embodiments, clock generator 5516 receives one or more Frequency Identification (FID) signals, and generates the clock signals at an appropriate frequency, based on the FID signals.

In some embodiments, device 5500 comprises battery 5518 supplying power to various components of device 5500. Merely as an example, battery 5518 is illustrated to be supplying power to processor 5504. Although not illustrated in the figures, device 5500 may comprise a charging circuitry, e.g., to recharge the battery, based on Alternating Current (AC) power supply received from an AC adapter.

In some embodiments, battery 5518 periodically checks an actual battery capacity or energy with charge to a preset voltage (e.g., 4.1 V). The battery then decides of the battery capacity or energy. If the capacity or energy is insufficient, then an apparatus in or associated with the battery slightly increases charging voltage to a point where the capacity is sufficient (e.g. from 4.1 V to 4.11 V). The process of periodically checking and slightly increase charging voltage is performed until charging voltage reaches specification limit (e.g., 4.2 V). The scheme described herein has benefits such as battery longevity can be extended, risk of insufficient energy reserve can be reduced, burst power can be used as long as possible, and/or even higher burst power can be used.

In some embodiments, the charging circuitry (e.g., 5518) comprises a buck-boost converter. This buck-boost converter comprises DrMOS or DrGaN devices used in place of half-bridges for traditional buck-boost converters. Various embodiments here are described with reference to DrMOS. However, the embodiments are applicable to DrGaN. The DrMOS devices allow for better efficiency in power conversion due to reduced parasitic and optimized MOSFET packaging. Since the dead-time management is internal to the DrMOS, the dead-time management is more accurate than for traditional buck-boost converters leading to higher efficiency in conversion. Higher frequency of operation allows for smaller inductor size, which in turn reduces the z-height of the charger comprising the DrMOS based buck-boost converter. The buck-boost converter of various embodiments comprises dual-folded bootstrap for DrMOS devices. In some embodiments, in addition to the traditional bootstrap capacitors, folded bootstrap capacitors are added that cross-couple inductor nodes to the two sets of DrMOS switches.

In some embodiments, device 5500 comprises Power Control Unit (PCU) 5510 (also referred to as Power Management Unit (PMU), Power Management Controller (PMC), Power Unit (p-unit), etc.). In an example, some sections of PCU 5510 may be implemented by one or more processing cores 5508, and these sections of PCU 5510 are symbolically illustrated using a dotted box and labelled PCU 5510a. In an example, some other sections of PCU 5510 may be implemented outside the processing cores 5508, and these sections of PCU 5510 are symbolically illustrated using a dotted box and labelled as PCU 5510b. PCU 5510 may implement various power management operations for device 5500. PCU 5510 may include hardware interfaces, hardware circuitries, connectors, registers, etc., as well as software components (e.g., drivers, protocol stacks), to implement various power management operations for device 5500.

In various embodiments, PCU or PMU 5510 is organized in a hierarchical manner forming a hierarchical power management (HPM). HPM of various embodiments builds a capability and infrastructure that allows for package level management for the platform, while still catering to islands of autonomy that might exist across the constituent die in the package. HPM does not assume a pre-determined mapping of physical partitions to domains. An HPM domain can be aligned with a function integrated inside a dielet, to a dielet boundary, to one or more dielets, to a companion die, or even a discrete CXL device. HPM addresses integration of multiple instances of the same die, mixed with proprietary functions or 3rd party functions integrated on the same die or separate die, and even accelerators connected via CXL (e.g., Flexbus) that may be inside the package, or in a discrete form factor.

HPM enables designers to meet the goals of scalability, modularity, and late binding. HPM also allows PMU functions that may already exist on other dice to be leveraged, instead of being disabled in the flat scheme. HPM enables management of any arbitrary collection of functions independent of their level of integration. HPM of various embodiments is scalable, modular, works with symmetric multi-chip processors (MCPs), and works with asymmetric MCPs. For example, HPM does not need a signal PM controller and package infrastructure to grow beyond reasonable scaling limits. HPM enables late addition of a die in a package without the need for change in the base die infrastructure. HPM addresses the need of disaggregated solutions having dies of different process technology nodes coupled in a single package. HPM also addresses the needs of companion die integration solutions—on and off package.

In various embodiments, each die (or dielet) includes a power management unit (PMU) or p-unit. For example, processor dies can have a supervisor p-unit, supervisee p-unit, or a dual role supervisor/supervisee p-unit. In some embodiments, an I/O die has its own dual role p-unit such as supervisor and/or supervisee p-unit. The p-units in each die can be instances of a generic p-unit. In one such example, all p-units have the same capability and circuits, but are configured (dynamically or statically) to take a role of a supervisor, supervisee, and/or both. In some embodiments, the p-units for compute dies are instances of a compute p-unit while p-units for IO dies are instances of an IO p-unit different from the compute p-unit. Depending on the role, p-unit acquires specific responsibilities to manage power of the multichip module and/or computing platform. While various p-units are described for dies in a multichip module or system-on-chip, a p-unit can also be part of an external device such as I/O device.

Here, the various p-units do not have to be the same. The HPM architecture can operate very different types of p-units. One common feature for the p-units is that they are expected to receive HPM messages and are expected to be able to comprehend them. In some embodiments, the p-unit of IO dies may be different than the p-unit of the compute dies. For example, the number of register instances of each class of register in the IO p-unit is different than those in the p-units of the compute dies. An IO die has the capability of being an HPM supervisor for CXL connected devices, but compute die may not need to have that capability. The IO and computes dice also have different firmware flows and possibly different firmware images. These are choices that an implementation can make. An HPM architecture can choose to have one superset firmware image and selectively execute flows that are relevant to the die type the firmware is associated with. Alternatively, there can be a customer firmware for each p-unit type; it can allow for more streamlined sizing of the firmware storage requirements for each p-unit type.

The p-unit in each die can be configured as a supervisor p-unit, supervisee p-unit or with a dual role of supervisor/supervisee. As such, p-units can perform roles of supervisor or supervisee for various domains. In various embodiments, each instance of p-unit is capable of autonomously managing local dedicated resources and contains structures to aggregate data and communicate between instances to enable shared resource management by the instance configured as the shared resource supervisor. A message and wire-based infrastructure is provided that can be duplicated and configured to facilitate management and flows between multiple p-units.

In some embodiments, power and thermal thresholds are communicated by a supervisor p-unit to supervisee p-units. For example, a supervisor p-unit learns of the workload (present and future) of each die, power measurements of each die, and other parameters (e.g., platform level power boundaries) and determines new power limits for each die. These power limits are then communicated by supervisor p-units to the supervisee p-units via one or more interconnects and fabrics. In some embodiments, a fabric indicates a group of fabrics and interconnect including a first fabric, a second fabric, and a fast response interconnect. In some embodiments, the first fabric is used for common communication between a supervisor p-unit and a supervisee p-unit. These common communications include change in voltage, frequency, and/or power state of a die which is planned based on a number of factors (e.g., future workload, user behavior, etc.). In some embodiments, the second fabric is used for higher priority communication between supervisor p-unit and supervisee p-unit. Example of higher priority communication include a message to throttle because of a possible thermal runaway condition, reliability issue, etc. In some embodiments, a fast response interconnect is used for communicating fast or hard throttle of all dies. In this case, a supervisor p-unit may send a fast throttle message to all other p-units, for example. In some embodiments, a fast response interconnect is a legacy interconnect whose function can be performed by the second fabric.

The HPM architecture of various embodiments enables scalability, modularity, and late binding of symmetric and/or asymmetric dies. Here, symmetric dies are dies of same size, type, and/or function, while asymmetric dies are dies of different size, type, and/or function. Hierarchical approach also allows PMU functions that may already exist on other dice to be leveraged, instead of being disabled in the traditional flat power management scheme. HPM does not assume a pre-determined mapping of physical partitions to domains. An HPM domain can be aligned with a function integrated inside a dielet, to a dielet boundary, to one or more dielets, to a companion die, or even a discrete CXL device. HPM enables management of any arbitrary collection of functions independent of their level of integration. In some embodiments, a p-unit is declared a supervisor p-unit based on one or more factors. These factors include memory size, physical constraints (e.g., number of pin-outs), and locations of sensors (e.g., temperature, power consumption, etc.) to determine physical limits of the processor.

The HPM architecture of various embodiments, provides a means to scale power management so that a single p-unit instance does not need to be aware of the entire processor. This enables power management at a smaller granularity and improves response times and effectiveness. Hierarchical structure maintains a monolithic view to the user. For example, at an operating system (OS) level, HPM architecture gives the OS a single PMU view even though the PMU is physically distributed in one or more supervisor-supervisee configurations.

In some embodiments, the HPM architecture is centralized where one supervisor controls all supervisees. In some embodiments, the HPM architecture is decentralized, wherein various p-units in various dies control overall power management by peer-to-peer communication. In some embodiments, the HPM architecture is distributed where there are different supervisors for different domains. One example of a distributed architecture is a tree-like architecture.

In some embodiments, device 5500 comprises Power Management Integrated Circuit (PMIC) 5512, e.g., to implement various power management operations for device 5500. In some embodiments, PMIC 5512 is a Reconfigurable Power Management ICs (RPMICs) and/or an IMVP (Intel® Mobile Voltage Positioning). In an example, the PMIC is within an IC die separate from processor 5504. The may implement various power management operations for device 5500. PMIC 5512 may include hardware interfaces, hardware circuitries, connectors, registers, etc., as well as software components (e.g., drivers, protocol stacks), to implement various power management operations for device 5500.

In an example, device 5500 comprises one or both PCU 5510 or PMIC 5512. In an example, any one of PCU 5510 or PMIC 5512 may be absent in device 5500, and hence, these components are illustrated using dotted lines.

Various power management operations of device 5500 may be performed by PCU 5510, by PMIC 5512, or by a combination of PCU 5510 and PMIC 5512. For example, PCU 5510 and/or PMIC 5512 may select a power state (e.g., P-state) for various components of device 5500. For example, PCU 5510 and/or PMIC 5512 may select a power state (e.g., in accordance with the ACPI (Advanced Configuration and Power Interface) specification) for various components of device 5500. Merely as an example, PCU 5510 and/or PMIC 5512 may cause various components of the device 5500 to transition to a sleep state, to an active state, to an appropriate C state (e.g., C0 state, or another appropriate C state, in accordance with the ACPI specification), etc. In an example, PCU 5510 and/or PMIC 5512 may control a voltage output by VR 5514 and/or a frequency of a clock signal output by the clock generator, e.g., by outputting the VID signal and/or the FID signal, respectively. In an example, PCU 5510 and/or PMIC 5512 may control battery power usage, charging of battery 5518, and features related to power saving operation.

The clock generator 5516 can comprise a phase locked loop (PLL), frequency locked loop (FLL), or any suitable clock source. In some embodiments, each core of processor 5504 has its own clock source. As such, each core can operate at a frequency independent of the frequency of operation of the other core. In some embodiments, PCU 5510 and/or PMIC 5512 performs adaptive or dynamic frequency scaling or adjustment. For example, clock frequency of a processor core can be increased if the core is not operating at its maximum power consumption threshold or limit. In some embodiments, PCU 5510 and/or PMIC 5512 determines the operating condition of each core of a processor, and opportunistically adjusts frequency and/or power supply voltage of that core without the core clocking source (e.g., PLL of that core) losing lock when the PCU 5510 and/or PMIC 5512 determines that the core is operating below a target performance level. For example, if a core is drawing current from a power supply rail less than a total current allocated for that core or processor 5504, then PCU 5510 and/or PMIC 5512 can temporality increase the power draw for that core or processor 5504 (e.g., by increasing clock frequency and/or power supply voltage level) so that the core or processor 5504 can perform at higher performance level. As such, voltage and/or frequency can be increased temporality for processor 5504 without violating product reliability.

In an example, PCU 5510 and/or PMIC 5512 may perform power management operations, e.g., based at least in part on receiving measurements from power measurement circuitries 5542, temperature measurement circuitries 5540, charge level of battery 5518, and/or any other appropriate information that may be used for power management. To that end, PMIC 5512 is communicatively coupled to one or more sensors to sense/detect various values/variations in one or more factors having an effect on power/thermal behavior of the system/platform. Examples of the one or more factors include electrical current, voltage droop, temperature, operating frequency, operating voltage, power consumption, inter-core communication activity, etc. One or more of these sensors may be provided in physical proximity (and/or thermal contact/coupling) with one or more components or logic/IP blocks of a computing system. Additionally, sensor(s) may be directly coupled to PCU 5510 and/or PMIC 5512 in at least one embodiment to allow PCU 5510 and/or PMIC 5512 to manage processor core energy at least in part based on value(s) detected by one or more of the sensors.

Also illustrated is an example software stack of device 5500 (although not all elements of the software stack are illustrated). Merely as an example, processors 5504 may execute application programs 5550, Operating System 5552, one or more Power Management (PM) specific application programs (e.g., generically referred to as PM applications 5558), and/or the like. PM applications 5558 may also be executed by the PCU 5510 and/or PMIC 5512. OS 5552 may also include one or more PM applications 5556*a*, 5556*b*, 5556*c*. The OS 5552 may also include various drivers 5554*a*, 5554*b*, 5554*c*, etc., some of which may be specific for power management purposes. In some embodiments, device 5500 may further comprise a Basic Input/output System (BIOS) 5520. BIOS 5520 may communicate with OS 5552 (e.g., via one or more drivers 5554), communicate with processors 5504, etc.

For example, one or more of PM applications 5558, 5556, drivers 5554, BIOS 5520, etc. may be used to implement power management specific tasks, e.g., to control voltage and/or frequency of various components of device 5500, to control wake-up state, sleep state, and/or any other appropriate power state of various components of device 5500, control battery power usage, charging of the battery 5518, features related to power saving operation, etc.

In some embodiments, battery 5518 is a Li-metal battery with a pressure chamber to allow uniform pressure on a battery. The pressure chamber is supported by metal plates (such as pressure equalization plate) used to give uniform pressure to the battery. The pressure chamber may include pressured gas, elastic material, spring plate, etc. The outer skin of the pressure chamber is free to bow, restrained at its edges by (metal) skin, but still exerts a uniform pressure on the plate that is compressing the battery cell. The pressure chamber gives uniform pressure to battery, which is used to enable high-energy density battery with, for example, 20% more battery life.

In some embodiments, pCode executing on PCU 5510*a/b* has a capability to enable extra compute and telemetries resources for the runtime support of the pCode. Here pCode refers to a firmware executed by PCU 5510*a/b* to manage performance of the 5501. For example, pCode may set frequencies and appropriate voltages for the processor. Part of the pCode are accessible via OS 5552. In various embodiments, mechanisms and methods are provided that dynamically change an Energy Performance Preference (EPP) value based on workloads, user behavior, and/or system conditions. There may be a well-defined interface between OS 5552 and the pCode. The interface may allow or facilitate the software configuration of several parameters and/or may provide hints to the pCode. As an example, an EPP parameter may inform a pCode algorithm as to whether performance or battery life is more important.

This support may be done as well by the OS 5552 by including machine-learning support as part of OS 5552 and either tuning the EPP value that the OS hints to the hardware (e.g., various components of SoC 5501) by machine-learning prediction, or by delivering the machine-learning prediction to the pCode in a manner similar to that done by a Dynamic Tuning Technology (DTT) driver. In this model, OS 5552 may have visibility to the same set of telemetries as are available to a DTT. As a result of a DTT machine-learning hint setting, pCode may tune its internal algorithms to achieve optimal power and performance results following the machine-learning prediction of activation type. The pCode as example may increase the responsibility for the processor utilization change to enable fast response for user activity, or may increase the bias for energy saving either by reducing the responsibility for the processor utilization or by saving more power and increasing the performance lost by tuning the energy saving optimization. This approach may facilitate saving more battery life in case the types of activities enabled lose some performance level over what the system can enable. The pCode may include an algorithm for dynamic EPP that may take the two inputs, one from OS 5552 and the other from software such as DTT, and may selectively choose to provide higher performance and/or responsiveness. As part of this method, the pCode may enable in the DTT an option to tune its reaction for the DTT for different types of activity.

In some embodiments, pCode improves the performance of the SoC in battery mode. In some embodiments, pCode allows drastically higher SoC peak power limit levels (and thus higher Turbo performance) in battery mode. In some embodiments, pCode implements power throttling and is part of Intel's Dynamic Tuning Technology (DTT). In various embodiments, the peak power limit is referred to PL4. However, the embodiments are applicable to other peak power limits. In some embodiments, pCode sets the Vth threshold voltage (the voltage level at which the platform will throttle the SoC) in such a way as to prevent the system from unexpected shutdown (or black screening). In some embodiments, pCode calculates the $P_{soc,pk}$ SoC Peak Power Limit (e.g., PL4), according to the threshold voltage (Vth). These are two dependent parameters, if one is set, the other can be calculated. pCode is used to optimally set one parameter (Vth) based on the system parameters, and the history of the operation. In some embodiments, pCode provides a scheme to dynamically calculate the throttling level (Psoc,th) based on the available battery power (which changes slowly) and set the SoC throttling peak power (Psoc,th). In some embodiments, pCode decides the frequencies and voltages based on Psoc,th. In this case, throttling events have less negative effect on the SoC performance Various embodiments provide a scheme which allows maximum performance (Pmax) framework to operate.

In some embodiments, VR 5514 includes a current sensor to sense and/or measure current through a high-side switch of VR 5514. In some embodiments the current sensor uses an amplifier with capacitively coupled inputs in feedback to sense the input offset of the amplifier, which can be compensated for during measurement. In some embodiments, the amplifier with capacitively coupled inputs in feedback is used to operate the amplifier in a region where the input common-mode specifications are relaxed, so that the feedback loop gain and/or bandwidth is higher. In some embodiments, the amplifier with capacitively coupled inputs in feedback is used to operate the sensor from the converter input voltage by employing high-PSRR (power supply rejection ratio) regulators to create a local, clean supply voltage, causing less disruption to the power grid in the switch area. In some embodiments, a variant of the design can be used to sample the difference between the input voltage and the controller supply, and recreate that between the drain voltages of the power and replica switches. This allows the sensor to not be exposed to the power supply voltage. In some embodiments, the amplifier with capacitively coupled inputs in feedback is used to compensate for power delivery network related (PDN-related) changes in the input voltage during current sensing.

In some embodiments, VR 5514 includes LDO regulator that comprises a dual loop regulation mechanism. A first loop of the dual loop is an analog loop that compares the voltage on the output supply node with a reference, and generates a bias or voltage control to control a strength of the final power switch. The first loop regulates the output voltage relative to a reference voltage by minimizing the error between the two voltages. A second loop of the dual loop is a digital loop that controls a current source which injects current on the gate of the final power switch to boost current for a load. The second loop is an auxiliary loop. In some embodiments, the auxiliary loop boost the current load for a set interval till the tracking BW of the LDO resolves the error in the output, thereby reducing the peak-to-peak noise. In some embodiments, the quiescent current is not increased a lot by the second loop since the second loop circuit is on for a fraction of the entire LDO operation. In some embodiments, to combat data pattern dependency, a voltage comparator is used to control the current injector to prevent the output voltage going in the opposite direction.

Some embodiments use three components to adjust the peak power of SoC 5501 based on the states of a USB TYPE-C device 5529. These components include OS Peak Power Manager (part of OS 5552), USB TYPE-C Connector Manager (part of OS 5552), and USB TYPE-C Protocol Device Driver (e.g., one of drivers 5554a, 5554b, 5554c). In some embodiments, the USB TYPE-C Connector Manager sends a synchronous request to the OS Peak Power Manager when a USB TYPE-C power sink device is attached or detached from SoC 5501, and the USB TYPE-C Protocol Device Driver sends a synchronous request to the Peak Power Manager when the power sink transitions device state. In some embodiments, the Peak Power Manager takes power budget from the CPU when the USB TYPE-C connector is attached to a power sink and is active (e.g., high power device state). In some embodiments, the Peak Power Manager gives back the power budget to the CPU for performance when the USB TYPE-C connector is either detached or the attached and power sink device is idle (lowest device state).

In some embodiments, logic is provided to dynamically pick the best operating processing core for BIOS power-up flows and sleep exit flows (e.g., S3, S4, and/or S5). The selection of the bootstrap processor (BSP) is moved to an early power-up time instead of a fixed hardware selection at any time. For maximum boot performance, the logic selects the fastest capable core as the BSP at an early power-up time. In addition, for maximum power saving, the logic selects the most power efficient core as the BSP. Processor or switching for selecting the BSP happens during the boot-up as well as power-up flows (e.g., S3, S4, and/or S5 flows).

In some embodiments, the memories herein are organized in multi-level memory architecture and their performance is governed by a decentralized scheme. The decentralized scheme includes p-unit 5510 and memory controllers. In some embodiments, the scheme dynamically balances a number of parameters such as power, thermals, cost, latency and performance for memory levels that are progressively further away from the processor in the platform 5500 based on how applications are using memory levels that are further away from processor cores. In some examples, the decision making for the state of the far memory (FM) is decentralized. For example, a processor power management unit (p-unit), near memory controller (NMC), and/or far memory host controller (FMHC) makes decisions about the power and/or performance state of the FM at their respective levels. These decisions are coordinated to provide the most optimum power and/or performance state of the FM for a given time. The power and/or performance state of the memories adaptively change to changing workloads and other parameters even when the processor(s) is in a particular power state.

In some embodiments, an apparatus is provided that executes a power-up scheme for system 5500. In some embodiment, the apparatus applies a biometric sensor (e.g., a fingerprint sensor, eye sensor, etc.) to authenticate a user before enabling power-up of computing system 5500 or to resume transition to a power state (e.g., one of the power states defined by the Advance Configuration and Power Interface (ACPI)). Output of the biometric sensor is compared against data of a registered user for a match. The data may include an original copy of an output of the biometric sensor saved in a non-volatile memory (e.g., serial peripheral interface (SPI) flash device). If a match exists, a logic in the computing system will allow the computing system to power-up. In the absence of a match, the computing system will not be powered up. In some examples, battery charging of battery 5518 is also disabled if the match is not found.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional elements.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "analog signal" is any continuous signal for which the time varying feature (variable) of the signal is a representation of some other time varying quantity, i.e., analogous to another time varying signal.

The term "digital signal" is a physical signal that is a representation of a sequence of discrete values (a quantified discrete-time signal), for example of an arbitrary bit stream, or of a digitized (sampled and analog-to-digital converted) analog signal.

The term "scaling" generally refers to converting a design (schematic and layout) from one process technology to another process technology and may be subsequently being reduced in layout area. In some cases, scaling also refers to upsizing a design from one process technology to another process technology and may be subsequently increasing layout area. The term "scaling" generally also refers to downsizing or upsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top." "bottom," "over," "under," and the like in the description and in the claims, if any, are used for descriptive purposes and not necessarily for describing permanent relative positions.

It is pointed out that those elements of the figures having the same reference numbers (or names) as the elements of any other figure can operate or function in any manner similar to that described but are not limited to such.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors (BJT PNP/NPN), BiCMOS, CMOS, etc., may be used without departing from the scope of the disclosure.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process. The examples can be combined in any combinations. For example, example 4 can be combined with example 2.

Example 1: An apparatus comprising: a memory controller; a memory IO physical layer coupled to the memory controller; and a voltage supply generator coupled to the memory IO physical layer, wherein the voltage supply generator is to provide an adjustable voltage supply to the memory IO physical layer, wherein the memory controller is to instruct the voltage supply generator directly or indirectly to change the adjustable voltage supply according to noise level on a data link that couples the memory IO physical layer to a memory.

Example 2: The apparatus of example 1, wherein the memory controller is to enable or disable an error detection mechanism according to noise level on the data link.

Example 3: The apparatus of example 2, wherein the memory controller is to decrease the voltage level of the adjustable voltage supply and enable the error detection mechanism.

Example 4: The apparatus of example 2, wherein the memory controller is to increase the voltage level of the adjustable voltage supply and to disable the error detection mechanism.

Example 5: The apparatus of example 2, wherein the memory controller is to dynamically enable or disable the error detection mechanism and/or adjust a voltage to the adjustable voltage supply.

Example 6: The apparatus of example 2, wherein the error detection mechanism comprises cyclic redundancy check.

Example 7: The apparatus of example 1, wherein the memory controller is to club read operations together, and wherein the memory controller is to instruct the voltage supply generator to directly or indirectly to lower the adjustable voltage supply prior to the read operations.

Example 8: The apparatus of example 1, wherein the memory controller is to club write operations together, and wherein the memory controller is to instruct the voltage supply generator to directly or indirectly to increase the adjustable voltage supply prior to the write operations.

Example 9: The apparatus of example 8, wherein the memory controller is to instruct the voltage supply generator to directly or indirectly to increase the adjustable voltage supply prior to the write operations even when there is a high priority read operation between write operations.

Example 10: The apparatus of example 1, wherein the memory controller is to determine a transfer rate of the data link, and to instruct the voltage supply generator directly or indirectly to change the adjustable voltage supply according to the transfer rate of the data link.

Example 11: The apparatus of example 10, wherein the memory controller is to instruct the voltage supply generator directly or indirectly to increase the adjustable voltage supply if the transfer rate of the data link increases.

Example 12: The apparatus of example 10, wherein the memory controller is to instruct the voltage supply generator directly or indirectly to decrease the adjustable voltage supply if the transfer rate of the data link decrease.

Example 13: The apparatus of example 1, wherein the memory is a DRAM.

Example 14: The apparatus of example 1, wherein the data link is a DDR compliant data link.

Example 15: A machine-readable storage media having machine-executable instructions stored thereon that when executed cause one or more machines to perform a method comprising: instructing a voltage supply generator directly or indirectly to change an adjustable voltage supply to a memory IO physical layer according to noise level on a data link that couples the memory IO physical layer to a memory; and adjusting a voltage of the adjustable voltage supply.

Example 16: The machine-readable storage media of example 15 having machine-executable instructions stored thereon that when executed cause the one or more machines to perform the method comprising: enabling or disabling an error detection mechanism according to noise level on the data link.

Example 17: The machine-readable storage media of example 16 having machine-executable instructions stored thereon that when executed cause the one or more machines to perform the method comprising: decreasing the voltage level of the adjustable voltage supply and enable the error detection mechanism; and increasing the voltage level of the adjustable voltage supply and to disable the error detection mechanism.

Example 18: The machine-readable storage media of example 16 having machine-executable instructions stored thereon that when executed cause the one or more machines to perform the method comprising: clubbing read operations together; instructing the voltage supply generator to directly or indirectly to lower the adjustable voltage supply prior to the read operations; clubbing write operations together; and instructing the voltage supply generator to directly or indirectly to increase the adjustable voltage supply prior to the write operations.

Example 19: A system comprising: a processor comprising a plurality of processing cores; a memory controller coupled to the processor; a memory coupled to the memory controller via a memory IO physical layer; a wireless interface to allow the processor to communicate with another device; and a voltage supply generator coupled to the memory IO physical layer, wherein the voltage supply generator is to provide an adjustable voltage supply to the memory IO physical layer, wherein the memory controller is to instruct the voltage supply generator directly or indirectly to change the adjustable voltage supply according to noise level on a data link that couples the memory IO physical layer to a memory.

Example 20: The system of example 19, wherein memory controller is to enable or disable an error detection mechanism according to noise level on the data link.

Example 21: The system of example 19 according to any one of examples 2 to 14.

Example 22: A system comprising: a memory, a processor coupled to the memory, a wireless interface to allow the processor to communicate with another device, wherein the processor is to perform one or more operations according to the methods of any one of examples 15 to 18.

Example 23: An apparatus having means to perform a method according to the methods of any one of examples 15 to 18.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. An apparatus comprising:
   a memory controller;
   a memory Input/Output (IO) physical layer coupled to the memory controller; and
   a voltage supply generator coupled to the memory IO physical layer, wherein the voltage supply generator is to provide an adjustable voltage supply to the memory IO physical layer, wherein the memory controller is to instruct the voltage supply generator directly or indirectly to change the adjustable voltage supply and enable or disable an error detection mechanism used to detect errors in data conveyed over a data link that couples the memory IO physical layer to a memory according to noise level on the data link that couples the memory IO physical layer to the memory and based on a determination to either emphasize power conservation or to maintain performance.

2. The apparatus of claim 1, wherein the memory controller is to decrease a voltage level of the adjustable voltage supply and enable the error detection mechanism.

3. The apparatus of claim 1, wherein the memory controller is to increase a voltage level of the adjustable voltage supply and to the disable the error detection mechanism.

4. The apparatus of claim 1, wherein the memory controller is to dynamically enable or disable the error detection mechanism and/or adjust a voltage level of the adjustable voltage supply.

5. The apparatus of claim 1, wherein the error detection mechanism comprises cyclic redundancy check.

6. The apparatus of claim 1, wherein the memory controller is to club read operations together, and wherein the memory controller is to instruct the voltage supply generator directly or indirectly to lower the adjustable voltage supply prior to the read operations.

7. The apparatus of claim 1, wherein the memory controller is to club write operations together, and wherein the memory controller is to instruct the voltage supply generator to directly or indirectly to increase the adjustable voltage supply prior to the write operations.

8. The apparatus of claim 7, wherein the memory controller is to instruct the voltage supply generator directly or indirectly to increase the adjustable voltage supply prior to the write operations even when there is a high priority read operation between two of the write operations.

9. The apparatus of claim 1, wherein the memory controller is to determine a transfer rate of the data link, and to instruct the voltage supply generator directly or indirectly to change the adjustable voltage supply according to the transfer rate of the data link.

10. The apparatus of claim 9, wherein the memory controller is to instruct the voltage supply generator directly or indirectly to increase the adjustable voltage supply if the transfer rate of the data link increases.

11. The apparatus of claim 9, wherein the memory controller is to instruct the voltage supply generator directly or indirectly to decrease the adjustable voltage supply if the transfer rate of the data link decreases.

12. The apparatus of claim 1, wherein the memory is a dynamic random access memory (DRAM).

13. The apparatus of claim 1, wherein the data link is a dynamic data rate (DDR) compliant data link.

14. A machine-readable storage media having machine-executable instructions stored thereon that when executed cause one or more machines to perform a method comprising to:

determine to either emphasize power conservation or to maintain performance; and instruct a voltage supply generator directly or indirectly to change an adjustable voltage supply to a memory input/output (IO) physical layer and instruct to enable or disable an error detection mechanism used to detect errors in data conveyed over a data link that couples the memory IO physical layer to a memory according to noise level on the data link that couples the memory IO physical layer to the memory and based on the determination.

15. The machine-readable storage media of claim 14, having machine-executable instructions stored thereon that when executed cause the one or more machines to perform the method comprising to:

instruct to decrease the voltage level of the adjustable voltage supply and instruct to enable the error detection mechanism.

16. The machine-readable storage media of claim 14, having machine-executable instructions stored thereon that when executed cause the one or more machines to perform the method comprising to:

club read operations together;

instruct the voltage supply generator directly or indirectly to lower the adjustable voltage supply prior to the read operations.

17. A system comprising:

a processor comprising a plurality of cores;

a memory controller coupled to the processor;

a memory coupled to the memory controller via a memory input/output (IO) physical layer;

a wireless interface to allow the processor to communicate with another device;

a voltage supply generator coupled to the memory IO physical layer, wherein the voltage supply generator is to provide an adjustable voltage supply to the memory IO physical layer, wherein the memory controller is to instruct the voltage supply generator directly or indirectly to change the adjustable voltage supply and enable or disable an error detection mechanism used to detect errors in data conveyed over a data link that couples the memory IO physical layer to a memory according to noise level on the data link that couples the memory IO physical layer to the memory and based on a determination to either emphasize power conservation or to maintain performance.

* * * * *